United States Patent
Zuolo et al.

(10) Patent No.: US 12,393,846 B2
(45) Date of Patent: Aug. 19, 2025

(54) PARTITIONABLE NEURAL NETWORK FOR SOLID STATE DRIVES

(71) Applicant: Microchip Technology Inc., Chandler, AZ (US)

(72) Inventors: Lorenzo Zuolo, Lusia (IT); Rino Micheloni, Turate (IT)

(73) Assignee: Microchip Technology Inc., Chandler, AZ (US)

( * ) Notice: Subject to any disclaimer, the term of this patent is extended or adjusted under 35 U.S.C. 154(b) by 1218 days.

(21) Appl. No.: 17/148,200

(22) Filed: Jan. 13, 2021

(65) Prior Publication Data

US 2022/0058488 A1    Feb. 24, 2022

Related U.S. Application Data

(60) Provisional application No. 63/068,349, filed on Aug. 20, 2020.

(51) Int. Cl.
*G06N 3/084*    (2023.01)
*G06N 3/04*    (2023.01)
*G06N 3/045*    (2023.01)

(52) U.S. Cl.
CPC .............. *G06N 3/084* (2013.01); *G06N 3/04* (2013.01); *G06N 3/045* (2023.01)

(58) Field of Classification Search
CPC .......... G06N 3/084; G06N 3/045; G06N 3/04; G06N 3/082; G11C 29/028;
(Continued)

(56) References Cited

U.S. PATENT DOCUMENTS 6,119,260 A    9/2000    Tomisawa et al.
6,567,313 B2    5/2003    Tanaka et al.
(Continued)

FOREIGN PATENT DOCUMENTS

WO    WO-2020152296 A1 *    7/2020    ............ G06N 3/045
WO    2020117348 A3    12/2020

OTHER PUBLICATIONS

Santara et al., "BASS Net: Band-Adaptive Spectral-Spatial Feature Learning Neural Network for Hyperspectral Image Classification," in 55.9 IEEE Transactions on Geoscience and Remote Sensing 5293-5301 (2017). (Year: 2017).*

(Continued)

*Primary Examiner* — Ryan C Vaughn
(74) *Attorney, Agent, or Firm* — Glass & Associates; Kenneth Glass

(57) ABSTRACT

A method includes storing configuration files of a Multi-Core Neural Network Inference (MCNNI) model having Independent Categorized-Core-Portions (ICCP). Each ICCP corresponds to one of a plurality of categories for each parameter. Some weighting values on each row of the weighting matrix of the MCNNI model have a nonzero value and some weighting values on each row have a value of zero. The configuration files are loaded into a neural network engine. The operation of the flash controller integrated circuit is monitored to identify a usage value corresponding to each of the parameters. A single neural network operation is performed using the usage values as input to generate output values. The output values of the ICCP that corresponds to the input usage values are identified and a TVSO value corresponding to the identified output values is identified. A read of a flash memory device is performed using the identified TVSO value.

5 Claims, 17 Drawing Sheets

(58) Field of Classification Search
CPC . G11C 11/5642; G11C 16/26; G11C 16/3427; G11C 16/349
See application file for complete search history.

(56) References Cited

U.S. PATENT DOCUMENTS

| | | | |
|---|---|---|---|
| 6,704,871 | B1 | 3/2004 | Kaplan et al. |
| 7,529,215 | B2 | 5/2009 | Osterling et al. |
| 7,650,480 | B2 | 1/2010 | Jiang |
| 7,930,623 | B2 | 4/2011 | Pisek et al. |
| 8,429,325 | B1 | 4/2013 | Onufryk et al. |
| 8,621,318 | B1 | 12/2013 | Micheloni et al. |
| 8,656,257 | B1 | 2/2014 | Micheloni et al. |
| 8,665,648 | B2 | 3/2014 | Mun et al. |
| 8,689,074 | B1 | 4/2014 | Tai |
| 8,694,849 | B1 | 4/2014 | Micheloni et al. |
| 8,694,855 | B1 | 4/2014 | Micheloni et al. |
| 8,707,122 | B1 | 4/2014 | Micheloni et al. |
| 8,769,380 | B1 | 7/2014 | Burd et al. |
| 8,966,335 | B2 | 2/2015 | Lunelli et al. |
| 8,971,112 | B2 | 3/2015 | Crippa et al. |
| 8,984,376 | B1 | 3/2015 | Norrie |
| 8,990,661 | B1 | 3/2015 | Micheloni et al. |
| 9,021,333 | B1 | 4/2015 | Northcott |
| 9,092,353 | B1 | 7/2015 | Micheloni et al. |
| 9,128,858 | B1 | 9/2015 | Micheloni et al. |
| 9,235,467 | B2 | 1/2016 | Micheloni et al. |
| 9,251,909 | B1 | 2/2016 | Camp et al. |
| 9,268,531 | B1 | 2/2016 | Woo et al. |
| 9,292,428 | B2 | 3/2016 | Kanamori et al. |
| 9,305,661 | B2 | 4/2016 | Micheloni et al. |
| 9,397,701 | B1 | 7/2016 | Micheloni et al. |
| 9,417,804 | B2 | 8/2016 | Micheloni et al. |
| 9,444,655 | B2 | 9/2016 | Sverdlov et al. |
| 9,448,881 | B1 | 9/2016 | Micheloni et al. |
| 9,450,610 | B1 | 9/2016 | Micheloni et al. |
| 9,454,414 | B2 | 9/2016 | Micheloni et al. |
| 9,564,922 | B1 | 2/2017 | Graumann et al. |
| 9,590,656 | B2 | 3/2017 | Micheloni et al. |
| 9,747,200 | B1 | 8/2017 | Micheloni |
| 9,799,405 | B1 | 10/2017 | Micheloni et al. |
| 9,813,080 | B1 | 11/2017 | Micheloni et al. |
| 9,886,214 | B2 | 2/2018 | Micheloni et al. |
| 9,892,794 | B2 | 2/2018 | Micheloni et al. |
| 9,899,092 | B2 | 2/2018 | Micheloni |
| 10,152,273 | B2 | 12/2018 | Micheloni et al. |
| 10,157,677 | B2 | 12/2018 | Marelli et al. |
| 10,216,422 | B2 | 2/2019 | Kim et al. |
| 10,230,396 | B1 | 3/2019 | Micheloni et al. |
| 10,283,215 | B2 | 5/2019 | Marelli et al. |
| 10,291,263 | B2 | 5/2019 | Marelli et al. |
| 10,332,613 | B1 | 6/2019 | Micheloni et al. |
| 10,490,288 | B1 | 11/2019 | Wang et al. |
| 10,715,307 | B1 | 7/2020 | Jin |
| 10,861,562 | B1 | 12/2020 | Xiong et al. |
| 11,398,291 | B2 | 7/2022 | Zuolo et al. |
| 11,514,994 | B1 | 11/2022 | Zuolo et al. |
| 11,886,989 | B2 * | 1/2024 | Gu .......................... G06N 3/08 |
| 2002/0144210 | A1 | 10/2002 | Borkenhagen et al. |
| 2006/0106743 | A1 | 5/2006 | Horvitz |
| 2006/0161830 | A1 | 7/2006 | Yedidia et al. |
| 2006/0282603 | A1 | 12/2006 | Onufryk et al. |
| 2007/0076873 | A1 | 4/2007 | Yamamoto et al. |
| 2007/0157064 | A1 | 7/2007 | Falik et al. |
| 2011/0231731 | A1 | 9/2011 | Gross et al. |
| 2011/0255453 | A1 | 10/2011 | Roh et al. |
| 2012/0166714 | A1 | 6/2012 | Mun et al. |
| 2012/0287719 | A1 | 11/2012 | Mun et al. |
| 2013/0343495 | A1 | 12/2013 | Han et al. |
| 2014/0040697 | A1 | 2/2014 | Loewenstein |
| 2014/0146605 | A1 | 5/2014 | Yang |
| 2014/0237313 | A1 | 8/2014 | Wang et al. |
| 2014/0281800 | A1 | 9/2014 | Micheloni et al. |
| 2014/0281823 | A1 | 9/2014 | Micheloni et al. |
| 2014/0310534 | A1 | 10/2014 | Gurgi et al. |
| 2015/0033037 | A1 | 1/2015 | Lidman |
| 2015/0049548 | A1 | 2/2015 | Park et al. |
| 2015/0100860 | A1 | 4/2015 | Lee et al. |
| 2016/0072527 | A1 | 3/2016 | Suzuki et al. |
| 2016/0124679 | A1 | 5/2016 | Huang et al. |
| 2016/0247581 | A1 | 8/2016 | Suzuki et al. |
| 2016/0266791 | A1 | 9/2016 | Lin et al. |
| 2016/0371014 | A1 | 12/2016 | Roberts |
| 2017/0133107 | A1 | 5/2017 | Ryan et al. |
| 2017/0149446 | A1 | 5/2017 | Tao et al. |
| 2017/0213597 | A1 | 7/2017 | Micheloni |
| 2017/0263311 | A1 | 9/2017 | Cometti |
| 2018/0005670 | A1 | 1/2018 | Lee et al. |
| 2018/0033490 | A1 | 2/2018 | Marelli et al. |
| 2018/0046541 | A1 | 2/2018 | Niu et al. |
| 2018/0314586 | A1 | 11/2018 | Artieri et al. |
| 2019/0004734 | A1 | 1/2019 | Kirshenbaum et al. |
| 2019/0073139 | A1 | 3/2019 | Kim et al. |
| 2019/0087119 | A1 | 3/2019 | Oh et al. |
| 2019/0095794 | A1 | 3/2019 | López et al. |
| 2019/0317901 | A1 | 10/2019 | Kachare et al. |
| 2020/0004455 | A1 | 1/2020 | Williams et al. |
| 2020/0066361 | A1 | 2/2020 | Ioannou et al. |
| 2020/0074269 | A1 | 3/2020 | Trygg et al. |
| 2020/0125955 | A1 | 4/2020 | Klinger et al. |
| 2020/0151539 | A1 | 5/2020 | Oh et al. |
| 2020/0183826 | A1 | 6/2020 | Beaudoin et al. |
| 2020/0184245 | A1 | 6/2020 | Huang et al. |
| 2020/0185027 | A1 | 6/2020 | Rom et al. |
| 2020/0210831 | A1 | 7/2020 | Zhang et al. |
| 2020/0401911 | A1 * | 12/2020 | Zhang ................. G06F 16/1734 |
| 2021/0109673 | A1 | 4/2021 | Kim et al. |
| 2021/0118137 | A1 | 4/2021 | Shi et al. |
| 2021/0192333 | A1 | 6/2021 | Thiruvengadam et al. |
| 2021/0273650 | A1 | 9/2021 | Parthasarathy et al. |
| 2021/0385012 | A1 | 12/2021 | Buethe et al. |
| 2021/0385682 | A1 | 12/2021 | Bedekar et al. |
| 2022/0012121 | A1 | 1/2022 | Xu et al. |
| 2022/0012572 | A1 * | 1/2022 | Chen ..................... G06N 3/045 |
| 2022/0027083 | A1 | 1/2022 | Zuolo et al. |
| 2022/0050632 | A1 | 2/2022 | Hong et al. |
| 2022/0051730 | A1 | 2/2022 | Choi et al. |
| 2022/0116056 | A1 | 4/2022 | Kaynak et al. |
| 2022/0129738 | A1 | 4/2022 | Kale |
| 2022/0165348 | A1 | 5/2022 | Zuolo et al. |
| 2022/0188604 | A1 | 6/2022 | Zuolo et al. |
| 2022/0270698 | A1 | 8/2022 | Zuolo et al. |
| 2022/0329262 | A1 | 10/2022 | Liu et al. |
| 2022/0342582 | A1 | 10/2022 | Graumann |
| 2022/0365845 | A1 | 11/2022 | Buch et al. |
| 2022/0374169 | A1 | 11/2022 | Zuolo et al. |
| 2022/0375532 | A1 | 11/2022 | Zuolo et al. |
| 2022/0382629 | A1 | 12/2022 | Graumann |
| 2022/0383970 | A1 | 12/2022 | Zuolo et al. |
| 2022/0416812 | A1 | 12/2022 | Wu |
| 2023/0087247 | A1 | 3/2023 | Li et al. |

OTHER PUBLICATIONS

Zambelli et al., "Mitigating Self-Heating in Solid State Drives for Industrial Internet-of-Things Edge Gateways," in 9.7 Electronics 1179 (2020). (Year: 2020).*
U.S. Appl. No. 17/234,993, filed Apr. 20, 2021, Lorenzo Zuolo.
U.S. Appl. No. 17/347,388, filed Jun. 14, 2021, Lorenzo Zuolo.
U.S. Appl. No. 17/385,857, filed Jul. 26, 2021, Lorenzo Zuolo.
U.S. Appl. No. 17/398,091, filed Aug. 10, 2021, Lorenzo Zuolo.
U.S. Appl. No. 17/506,735, filed Oct. 21, 2021, Lorenzo Zuolo.
Anonymous, "Training checkpoints | TensorFlow Core", Dec. 28, 2019, XP055886114, p. 1-p. 8, Retrieved from the Internet.
U.S. Appl. No. 17/089,891, filed Nov. 5, 2020, Lorenzo Zuolo.
U.S. Appl. No. 17/148,200, filed Jan. 13, 2021, Lorenzo Zuolo.
U.S. Appl. No. 17/213,675, filed Mar. 26, 2021, Lorenzo Zuolo.
U.S. Appl. No. 63/057,278, filed Jul. 27, 2020, Lorenzo Zuolo.
Noam Shazeer et al: Outrageously Large Neural Networks: The Sparsely-Gated Mixture-of-Experts Layer11 , Arxiv.Org, Cornell University Li Bra Ry, 201 Olin Li Bra Ry Cornell University Ithaca, NY 14853, Jan. 23, 2017.

(56) References Cited

OTHER PUBLICATIONS

PCT/US2021/012105, International Search Report and Written Opinion of the International Searching Authority, European Patent Office, mailed on Mar. 24, 2021.
PCT/US2021/013738, International Search Report and Written Opinion, European Patent Office, Jun. 7, 2021.
Yu Cai et al, "Errors in Flash-Memory-Based Solid-State Drives: Analysis, Mitigation, and Recovery" 11 , Arxiv.Org, Cornell University Library, 201 Olin Library Cornell University Ithaca, NY 14853, Nov. 28, 2017.
J. Mu et al., "The impact of faulty memory bit cells on the decoding of spatially-coupled LDPC codes," 2015 49th Asilomar Conference on Signals, Systems and Computers, Pacific Grove, CA, USA, 2015, pp. 1627-1631, doi: 10.1109/ACSSC .2015.7421423. (Year: 2015).

* cited by examiner

| | N | | | | N | | | | N | | | | N | | | |
|---|---|---|---|---|---|---|---|---|---|---|---|---|---|---|---|---|---|
| ICCP₁₁ | a | b | c | d | 0 | 0 | 0 | 0 | 0 | 0 | 0 | 0 | | 0 | 0 | 0 | 0 |
| | a | b | c | d | 0 | 0 | 0 | 0 | 0 | 0 | 0 | 0 | | 0 | 0 | 0 | 0 |
| | a | b | c | d | 0 | 0 | 0 | 0 | 0 | 0 | 0 | 0 | | 0 | 0 | 0 | 0 |
| | a | b | c | d | 0 | 0 | 0 | 0 | 0 | 0 | 0 | 0 | | 0 | 0 | 0 | 0 |
| ICCP₁₂ | 0 | 0 | 0 | 0 | a | b | c | d | 0 | 0 | 0 | 0 | | 0 | 0 | 0 | 0 |
| | 0 | 0 | 0 | 0 | a | b | c | d | 0 | 0 | 0 | 0 | | 0 | 0 | 0 | 0 |
| | 0 | 0 | 0 | 0 | a | b | c | d | 0 | 0 | 0 | 0 | | 0 | 0 | 0 | 0 |
| | 0 | 0 | 0 | 0 | a | b | c | d | 0 | 0 | 0 | 0 | | 0 | 0 | 0 | 0 |
| ICCP₂₁ | 0 | 0 | 0 | 0 | 0 | 0 | 0 | 0 | a | b | c | d | | 0 | 0 | 0 | 0 |
| | 0 | 0 | 0 | 0 | 0 | 0 | 0 | 0 | a | b | c | d | | 0 | 0 | 0 | 0 |
| | 0 | 0 | 0 | 0 | 0 | 0 | 0 | 0 | a | b | c | d | | 0 | 0 | 0 | 0 |
| | 0 | 0 | 0 | 0 | 0 | 0 | 0 | 0 | a | b | c | d | | 0 | 0 | 0 | 0 |
| ICCP₂₂ | 0 | 0 | 0 | 0 | 0 | 0 | 0 | 0 | 0 | 0 | 0 | 0 | ... | 0 | 0 | 0 | 0 |
| | 0 | 0 | 0 | 0 | 0 | 0 | 0 | 0 | 0 | 0 | 0 | 0 | | 0 | 0 | 0 | 0 |
| | 0 | 0 | 0 | 0 | 0 | 0 | 0 | 0 | 0 | 0 | 0 | 0 | | 0 | 0 | 0 | 0 |
| | 0 | 0 | 0 | 0 | 0 | 0 | 0 | 0 | 0 | 0 | 0 | 0 | | 0 | 0 | 0 | 0 |
| ICCP₃₁ | 0 | 0 | 0 | 0 | 0 | 0 | 0 | 0 | 0 | 0 | 0 | 0 | | 0 | 0 | 0 | 0 |
| | 0 | 0 | 0 | 0 | 0 | 0 | 0 | 0 | 0 | 0 | 0 | 0 | | 0 | 0 | 0 | 0 |
| | 0 | 0 | 0 | 0 | 0 | 0 | 0 | 0 | 0 | 0 | 0 | 0 | | 0 | 0 | 0 | 0 |
| | 0 | 0 | 0 | 0 | 0 | 0 | 0 | 0 | 0 | 0 | 0 | 0 | | 0 | 0 | 0 | 0 |
| ICCP₃₂ | 0 | 0 | 0 | 0 | 0 | 0 | 0 | 0 | 0 | 0 | 0 | 0 | | a | b | c | d |
| | 0 | 0 | 0 | 0 | 0 | 0 | 0 | 0 | 0 | 0 | 0 | 0 | | a | b | c | d |
| | 0 | 0 | 0 | 0 | 0 | 0 | 0 | 0 | 0 | 0 | 0 | 0 | | a | b | c | d |
| | 0 | 0 | 0 | 0 | 0 | 0 | 0 | 0 | 0 | 0 | 0 | 0 | | a | b | c | d |

FIG. 5

PARTITIONABLE NEURAL NETWORK FOR SOLID STATE DRIVES

CROSS-REFERENCE TO RELATED APPLICATIONS

The present application claims priority to U.S. Provisional Patent Application Ser. No. 63/068,349 filed on Aug. 20, 2020, the contents of which are incorporated by reference herein in their entirety.

BACKGROUND

Neural networks are effective for identifying solutions to questions relating to complex systems. However, when the complex system includes a large number of factors that affect the outcome of the inquiry and/or the complexity of the training data set requires significant numbers of hidden neurons to achieve accurate results, the size of the network becomes so a large that it is impractical to implement it in a stand-alone system such as a dedicated integrated circuit device for performing a specific function. In particular, the significant number of hidden neurons of the neural network dictates the use of a neural engine with so many gates that implementation on a single integrated circuit device becomes impractical because of the required semiconductor surface area, power requirements, cooling requirements, cost, inference latency, configuration file space, etc.

One method for solving this problem is to categorize each factor and to generate a different inference model for each category. Though this type of solution allows for processing of neural network operations on a single integrated circuit device, this solution requires a significant number of neural network configuration files, and requires that the configuration files be loaded into the neural network engine prior to each neural network operation. The required loading of many configuration files consumes power and adds to inference latency.

What is needed is a way to partition neural networks so that the same physical neural network can be used to generate multiple predictions of one or more output variable in parallel. Also, there is a need for a method and apparatus for identifying the best threshold voltage shift offset value to use in performing reads of a Solid State Drive (SSD).

The methods and apparatus of the present invention provide for partitioning neural networks such that the same physical neural network can be used to generate multiple predictions of one or more output variable in parallel. In addition, the methods and apparatus of the present invention allow for identifying the best threshold voltage shift offset value to use in performing reads of an SSD.

SUMMARY OF THE INVENTION

A method for generating a neural network inference model includes: receiving input indicating architecture of a neural network inference model, the architecture including a plurality of parameters; and receiving input indicating a plurality of different categories for each parameter. An initial neural network inference model is generated that includes a plurality of Independent Categorized-Core-Portions (ICCP's), each ICCP corresponding to one of the categories of each parameter and including input neurons, output neurons and hidden neurons coupled to the input neurons and the output neurons. The initial neural network inference model has a weighting matrix comprising rows and columns of weighting values, a first plurality of weighting values on each row having a nonzero value and a second plurality of weighting values on each row having a value of zero. Each ICCP has the same structure as other ICCP's, and none of the input neurons, output neurons or hidden neurons of a particular ICCP are effectively coupled to any of the input neurons, output neurons or hidden neurons of any of the other ICCP's responsive to the zero values. A plurality of data records are received, each data record including one or more parameter values. A training data set, a validation data set and a test data set are created by dividing the received data records. The initial neural network inference model is trained by: selecting a category; selecting a data record from the training data set having a parameter value corresponding to the selected category; performing a backpropagation algorithm on neurons corresponding to the selected category using the selected training data record; repeating the selecting a data record and the performing a backpropagation algorithm until all data records in the training data set corresponding to the selected category have been processed; continuing the selecting a category, selecting a data record, performing a backpropagation algorithm and the repeating until all categories have been processed. Configuration files of the neural network inference model are then stored.

In one example the output neurons of each ICCP are configured to generate an output value that indicates a number of errors of a Threshold-Voltage-Shift Read-Error (TVS-RE) curve at a particular Threshold Voltage Shift Offset (TVSO) value. In another example, the output neurons of each ICCP are configured to generate an output value indicating a coefficient of a Threshold-Voltage-Shift Read-Error (TVS-RE) curve.

A method for performing an inference operation includes storing configuration files of a neural network inference model on an integrated circuit device, the neural network inference model including a plurality of ICCP's, each ICCP corresponding to one of a plurality of categories for each parameter of the neural network inference model and including input neurons, output neurons and hidden neurons coupled to the input neurons and the output neurons, the neural network inference model having a weighting matrix comprising rows and columns of weighting values, a first plurality of weighting values on each row having a nonzero value and a second plurality of weighting values on each row having a value of zero. Each ICCP has the same number of input neurons, the same number of hidden neurons, the same number of output neurons, and the same connections between input neurons, hidden neurons and output neurons as the other ICCP's, and none of the input neurons, output neurons or hidden neurons of a particular ICCP effectively coupled to any of the input neurons, output neurons or hidden neurons of any of other ICCP responsive to zero values of the weighting matrix. The configuration files of the neural network inference model are loaded into a neural network engine of the integrated circuit device to form a neural network inference core. The operation of the integrated circuit device is monitored to identify a usage value corresponding to each of the parameters. A single neural network operation is performed on the neural network inference core using the usage values as input to each of the ICCP's to generate, at the output neurons of each ICCP, output values indicating an estimation of one or more variables. The output values of the ICCP that correspond to the input usage values are identified. The identified output values are then sent as output.

An integrated circuit device is disclosed that includes operating circuitry for performing one or more operations and generating values relating to the one or more operations and a data storage configured for storing a Multi-Core Neural Network Inference (MCNNI) model. The MCNNI model including a plurality of Independent Categorized-Core-Portions (ICCP's), each ICCP corresponding to one of a plurality of categories for each parameter in the MCNNI model and including input neurons, output neurons and hidden neurons coupled to the input neurons and the output neurons, each ICCP having the same number of input neurons, the same number of hidden neurons, the same number of output neurons, and the same connections between input neurons, hidden neurons and output neurons as the other ICCP's, and none of the input neurons, output neurons or hidden neurons of a particular ICCP coupled to any of the input neurons, output neurons or hidden neurons of any of the other ICCPs. The neural network inference model has a weighting matrix comprising rows and columns of weighting values, a first plurality of weighting values on each row having a nonzero value and a second plurality of weighting values on each row having a value of zero. The integrated circuit device is configured to identify usage values corresponding to the operations of the integrated circuit device. A neural network engine is coupled to the data storage, wherein the integrated circuit device is configured to load the MCNNI model into the neural network engine to form a MCNNI core and the neural network engine is configured for performing a single neural network operation of the MCNNI core using the usage values as input to the single neural network operation to generate, for each ICCP, an output value at each output neuron that corresponds to the categories represented by the particular ICCP core. The integrated circuit device includes a selection circuit configured for identifying the MCNNI core corresponding to the usage values input into the single neural network operation. The selection circuit is further configured to send the output values generated by the output neurons of the selected MCNNI core to one or more other circuits of the integrated circuit device.

The method and apparatus of the present invention models multiple factors that affect UBER and generates, on the flash controller, output that indicates a minimum value of a TVS-RE curve that accurately reflects the physical characteristics of the location that is to be read, both the structural characteristics of the location that is to be read (e.g., the wordline and the block that is to be read), the current age/physical degradation of the location that is to be read (e.g., the number of P/E cycles) and the current transitory characteristics of the location that is to be read (e.g., closed-block read disturb and closed-block retention time). Because the generated TVS-RE curve accurately represents the factors that affect UBER, the generated TVSO value corresponding to the minimum value of the TVS-RE curve will be the appropriate TVSO value for performing the read. Using the best TVSO value for performing the read results in a reduced number of read errors at the flash controller. The reduced number of read errors of the method and apparatus of the present invention effectively maintains UBER within acceptable levels during the lifetime of the SSD.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a diagram illustrating a weighting matrix of an MCNNI model in accordance with an embodiment of the present invention.

DETAILED DESCRIPTION

Figure 1:
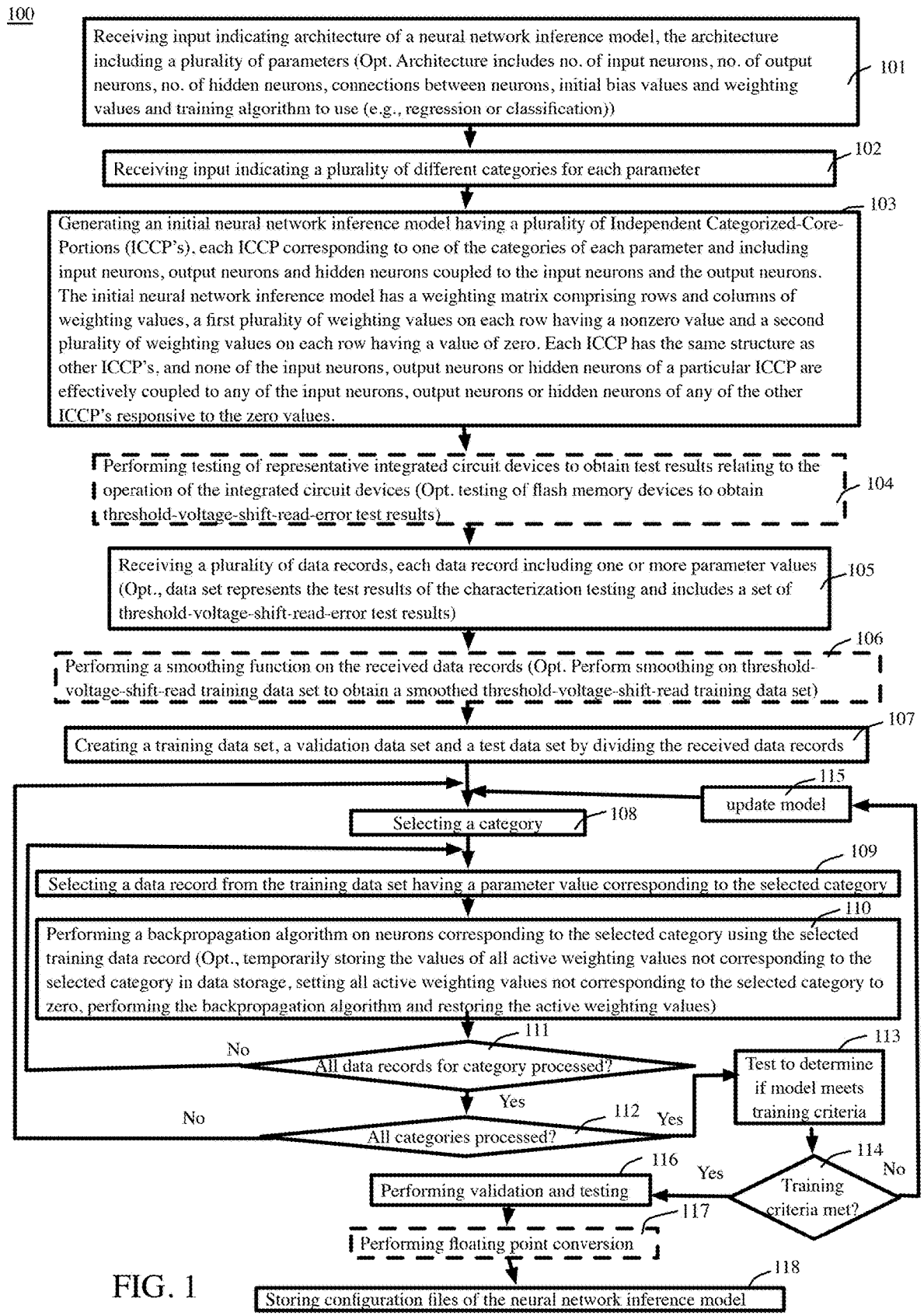
FIG. 1 is block diagram illustrating a method for generating a neural network inference model in accordance with an embodiment of the present invention.

FIG. 1 illustrates a method (100) for generating a neural network inference model that includes receiving input (101) that indicates architecture of a neural network inference model, the architecture including a plurality of parameters. In one example, the architecture includes one or more files that indicate parameters for the neural network model. The architecture may also include hyperparameters for the neural network model and may include the number of input neurons, the number of hidden neurons, the number of output neurons, the connections between neurons, initial bias values and weighting values and the training algorithm to use (e.g., a particular regression algorithm or a classification algorithm).

Input indicating a plurality of different categories for each parameter is received (102). In one example, an electronic file is received as input indicating categories for each parameter. Alternatively, categories for each parameter are input via a graphical user interface of a computer that is being used to perform one or more steps of method 100.

An initial neural network inference model is generated (103) having a plurality of ICCP's, each ICCP corresponding to one of the categories of each parameter and including input neurons, output neurons and hidden neurons coupled to the input neurons and the output neurons. The initial neural network inference model has a weighting matrix comprising rows and columns of weighting values, a first plurality of weighting values on each row having a nonzero value and a second plurality of weighting values on each row having a value of zero. Each ICCP has the same structure as other ICCP's, and none of the input neurons, output neurons or hidden neurons of a particular ICCP is effectively coupled to any of the input neurons, output neurons or hidden neurons of any of the other ICCP's responsive to the zero values. Physically a path may potentially exist between the input neurons, output neurons or hidden neurons of a particular ICCP and output neurons or hidden neurons of other ICCP's. However, due to the zero weighting value they are not effectively coupled.

Figures 2, 3:
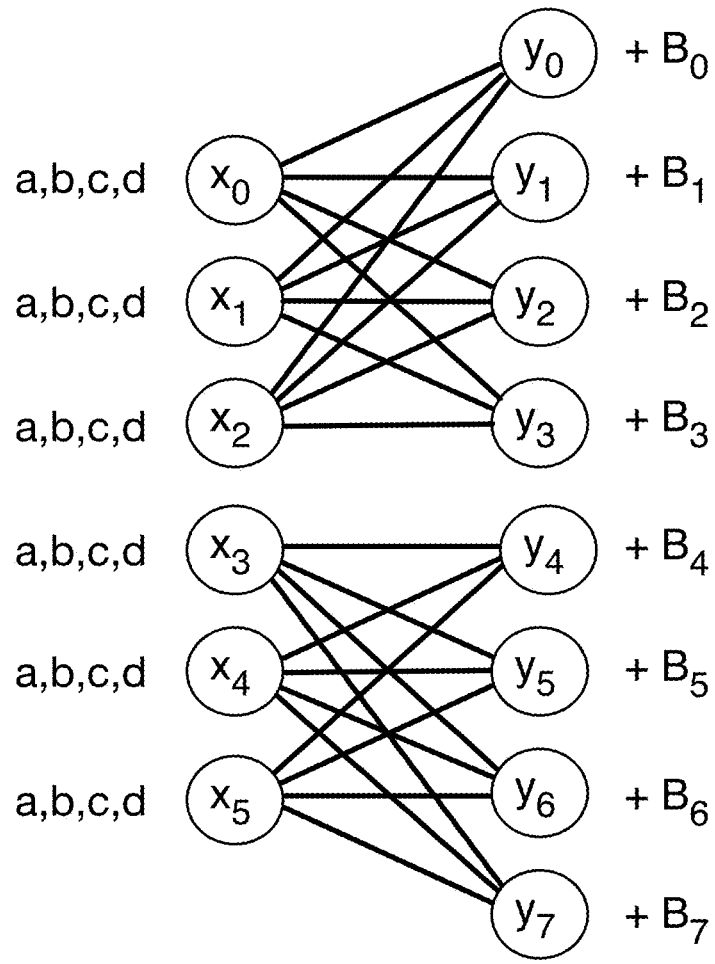
FIGS. 2-3 are diagrams illustrating an exemplary neural network inference model and how a Multi-Core Neural Network Inference (MCNNI) model can be generated in accordance with an embodiment of the present invention.

The mathematical operation of method 100 is illustrated in FIGS. 2-3 that show input parameter values received at particular input neurons as $x_0$-$x_5$, where parameters a, b, c and d are weights to generate output values $y_0$-$y_7$ representing the value of hidden neurons (not shown) plus a bias value $B_0$-$B_7$. This is illustrated by input parameter values $x_0$-$x_5$ multiplied by weighting values corresponding to parameters a, b, c and d of a weighting index that includes weighting values on each. The dotted line is a virtual line separating the top portion from the bottom portion, and is implemented by setting weighting values to zero in the appropriate row/columns of the weighting index. Setting the weighting values to zero thus separates the interconnected neural network into separate ICCPs.

In one example, the outputs of a Multi-Core Neural Network Inference (MCNNI) model are generated in accordance with the following exemplary equations, where the variable "y" represents the output value of each ICCP, the variables "x" represent inputs to each ICCP that may be referred to as "input parameter values", the variables a, b, c and d represent parameters (that may also be referred to as "weighting values") and the variables $B_0$-$B_7$ represent bias values.

$$y_0 = (x_0 * a) + (x_1 * a) + (x_2 * a) + (x_3 * 0) + (x_4 * 0) + (x_5 * 0) + B_0$$

$$y_1 = (x_0 * b) + (x_1 * b) + (x_2 * b) + (x_3 * 0) + (x_4 * 0) + (x_5 * 0) + B_1$$

$$y_2 = (x_0 * c) + (x_1 * c) + (x_2 * c) + (x_3 * 0) + (x_4 * 0) + (x_5 * 0) + B_2$$

$$y_3 = (x_0 * d) + (x_1 * d) + (x_2 * d) + (x_3 * 0) + (x_4 * 0) + (x_5 * 0) + B_3$$

$$y_4 = (x_0 * 0) + (x_1 * 0) + (x_2 * 0) + (x_3 * a) + (x_4 * a) + (x_5 * a) + B_4$$

$$y_5 = (x_0 * 0) + (x_1 * 0) + (x_2 * 0) + (x_3 * b) + (x_4 * b) + (x_5 * b) + B_5$$

$$y_6 = (x_0 * 0) + (x_1 * 0) + (x_2 * 0) + (x_3 * c) + (x_4 * c) + (x_5 * c) + B_6$$

$$y_7 = (x_0 * 0) + (x_1 * 0) + (x_2 * 0) + (x_3 * d) + (x_4 * d) + (x_5 * d) + B_7$$

Regression neural network models typically refer to the variable representing input into each input neuron (represented by the variable "$x_n$" in the above equation) as a "parameter" and such terminology is used in the present application, with the input values received at a particular input neuron referred to as "input parameter values." However, the methods and apparatus of the present invention may also use other types of neural networks. In some of these other types of neural networks, the input into each input neuron is referred to as a "feature." The term "parameter" as used in the present application shall not be construed as being limited to receiving input relating to a regression neural network, but shall include "features" when such term is applicable.

Figure 4:
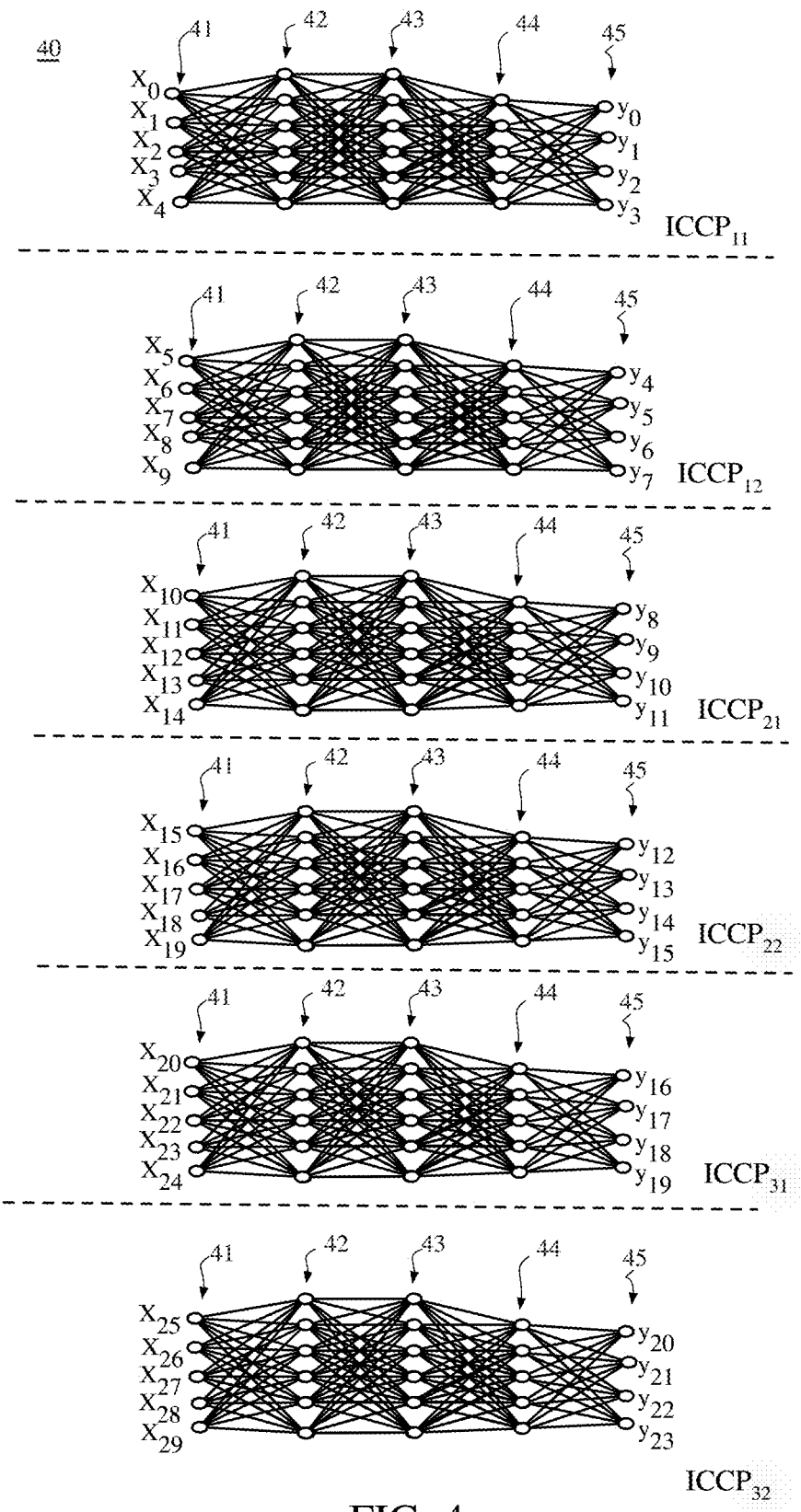
FIG. 4 is a diagram illustrating an MCNNI model in accordance with an embodiment of the present invention.

In one example step 103 includes generating an ICCP for each combination of the received categories. In the following examples, independent core portions are indicated with subscripts in which the first subscript indicates the categories of the first parameter, the second subscript indicates the category of the second parameter, and so forth. For example, in an embodiment in which there are three categories for a first parameter and two categories for a second parameter that is illustrated in FIG. 4, six ICCP's will be generated to form MCNNI model 40. The six ICCP's include a first ICCP corresponding the first category of the first parameter and the first category of the second parameter ($ICCP_{11}$), a second ICCP corresponding to the first category of the first parameter and the second category of the second parameter ($ICCP_{12}$), a third ICCP corresponding to the second category of the first parameter and the first category of the second parameter ($ICCP_{21}$), a fourth ICCP corresponding to the second category of the first parameter and the second category of the second parameter ($ICCP_{22}$), a fifth ICCP corresponding to the third category of the first parameter and the first category of the second parameter ($ICCP_{31}$) and a sixth ICCP corresponding to the third category of the first parameter and the second category of the second parameter ($ICCP_{32}$). MCNNI model 40 includes a plurality of input neurons 41, a plurality of output neurons 45 and layers 42-44 of hidden neurons. It can be seen that each ICCP in MCNNI model 40 has the same structure as the other ICCP's, and none of the input neurons, output neurons or hidden neurons of a particular ICCP are effectively coupled to any of the input neurons, output neurons or hidden neurons of any of the other ICCP's. The term "not effectively coupled" or "none of . . . are effectively coupled" as used in the present application shall mean either 1) not physically coupled or 2) physically coupled, but physically coupled in such a way that the "0" values in the weighting matrix make the physical coupling inoperable."

Input neurons 41 of $ICCP_{11}$ receive input parameter values $x_0$, $x_1$, $x_2$, $x_3$ and $x_4$. Input neurons 41 of $ICCP_{12}$ receive input parameter values $x_5$, $x_6$, $x_7$, $x_8$ and $x_9$. Input neurons 41 of $ICCP_{21}$ receive input parameter values $x_{10}$, $x_{11}$, $x_{12}$, $x_{13}$ and $x_{14}$. Input neurons 41 of $ICCP_{22}$ receive input parameter values $x_{16}$, $x_{16}$, $x_{17}$, $x_{18}$ and $x_{19}$. Input neurons 41 of $ICCP_{31}$ receive input parameter values $x_{20}$, $x_{21}$, $x_{22}$, $x_{23}$ and $x_{24}$. Input neurons 41 of ICCP, receive input parameter values $x_{25}$, $x_{26}$, $x_{27}$, $x_{28}$ and $x_{29}$.

FIG. 5 is a diagram illustrating a weighting matrix of a MCNNI model in accordance with an embodiment of the present invention. Weighting values having a nonzero value (which may be referred to hereinafter as active weighting values) form the various inference cores in the MCNNI model. More particularly, the weighting values (a, b, c, d) in rows 1-4 and columns 1-4 form the inference core for a first $ICCP_{11}$, the weighting values (a, b, c, d) in rows 5-8 and columns 5-8 form the inference core for a second $ICCP_{12}$ and so forth. It can be seen that all weighting values on each row that are not active weighting values have a value of zero. More particularly, the first four columns and the first n rows (where n is four) include active values for first $ICCP_{11}$, the next four columns and n rows include active values for second $ICCP_{12}$, the next four columns and n rows include active values for third $ICCP_{21}$, the next four columns and n rows include active values for fourth $ICCP_{22}$, the next four columns and n rows include active values for fifth $ICCP_{31}$ and the last four columns and n rows include active values for sixth $ICCP_{32}$.

Optionally, testing of representative integrated circuit devices is performed (104) to obtain test results relating to the operation of the integrated circuit device as will be discussed in further detail below.

A plurality of data records are received (105), each data record including one or more parameter values. The data records are labeled examples, each of which includes a plurality of features (a.k.a attributes), some or all of which may be parameters of the model (e.g., the variables "$x_i$", in the model that is received at a particular input neuron) and a corresponding label (e.g., a "y" value), i.e. the output of the respective ICCP.

Optionally, a smoothing function may be performed on the data records (106), as will be discussed in detail below.

A training data set, a validation data set and a test data set are created (107) by dividing the received data records. In one example the received data records are divided randomly into the respective data sets.

The initial neural network inference model generated in 103 is trained by selecting a category (108), selecting a data record (109) from the training data set having a parameter value corresponding to the selected category and performing a backpropagation algorithm (110) on neurons corresponding to the selected category using the selected training data record. In the above example in which there are three categories for a first parameter and two categories for a second parameter, if the selected category is the first category the neurons of ICCP's belonging to the first category of the first parameter will be trained. More particularly, the neurons of $ICCP_{11}$ and $ICCP_{12}$ will be trained using the selected data record. The selecting a data record (109) and the performing a backpropagation algorithm (110) are repeated until all data records in the training data set corresponding to the selected category have been processed (111).

Steps 108-111 are repeated until all categories have been processed (112). Thus, in the above example, the process of steps 108-111 is repeated a total of five times, once for each category. In this example, a first iteration of steps 108-111 will be performed to train the neurons of the $ICCP_{11}$ and $ICCP_{12}$ (those that are responsive to input parameter values $x_0$-$x_9$, i.e. those neurons for which the weighting value for these parameter values has have not been set to zero) using data records that correspond to the first category of the first parameter. A second iteration of steps 108-111 will be performed to train the neurons of $ICCP_{21}$ and $ICCP_{22}$ (those that are responsive to input parameter values $x_{10}$-$x_{19}$, i.e. those neurons for which the weighting value for these parameter values as have not been set to zero) using data records that correspond to the second category of the first parameter. A third iteration of steps 108-111 will be performed to train the neurons of $ICCP_{31}$ and $ICCP_{32}$ (those that are responsive to input parameter values input neurons $x_{20}$-$x_{29}$, i.e. those neurons for which the weighting value for these parameter values has not been set to zero) using data records corresponding to the third category of the first parameter. A fourth iteration of steps 108-111 is performed to train the neurons of $ICCP_{11}$ and $ICCP_{21}$ and $ICCP_{31}$ using data records corresponding to the first category of the second parameter. The fifth iteration of steps 108-111 trains the neurons of $ICCP_{12}$, $ICCP_{22}$, and $ICCP_{32}$ using data records corresponding to the second category of the second parameter.

In one example step 110 includes temporarily storing all weighting values in the first plurality of weighting values not corresponding to the ICCP that is being trained in data storage (so that they will not be altered by the backpropagation); performing the backpropagation algorithm; and then restoring each of the weighting values in the other ICCP's back to its respective temporarily stored value after the backpropagation algorithm has been performed. By storing and replacing weighting values during training, only the ICCP to be trained is modified during the training iteration.

The algorithm used for training may be a regression algorithm so as to identify coefficients or values relating to a curve that represents the training data. Alternatively, a classification algorithm or linear regression algorithm may be used.

The resulting trained neural network inference model is tested (113) to determine whether the trained neural network inference model meets training criteria, and if the training criteria are not met (114-115) the model is updated (115) and the process of steps 108-114 is repeated. The criteria used in steps 113 may be a cost function that determines "the goodness" of the training process. In one example, inference operations are performed using data records in the threshold-voltage-shift-read training data set and a Min-Squared-Error (MSE) function is used to identify the MSE achieved by training using the training data set.

When the training criteria are met in step 114, validation and testing of the trained neural network inference model are performed (116).

Optionally, a floating point conversion is performed (117). In one example step 117 includes converting the configuration files of the MCNNI model from floating point to fixed point (e.g. 40 bits fixed point) to speed up the inference time of the resulting final MCNNI model.

Configuration files of the trained, validated and tested neural network inference model are stored (118).

Figure 6:
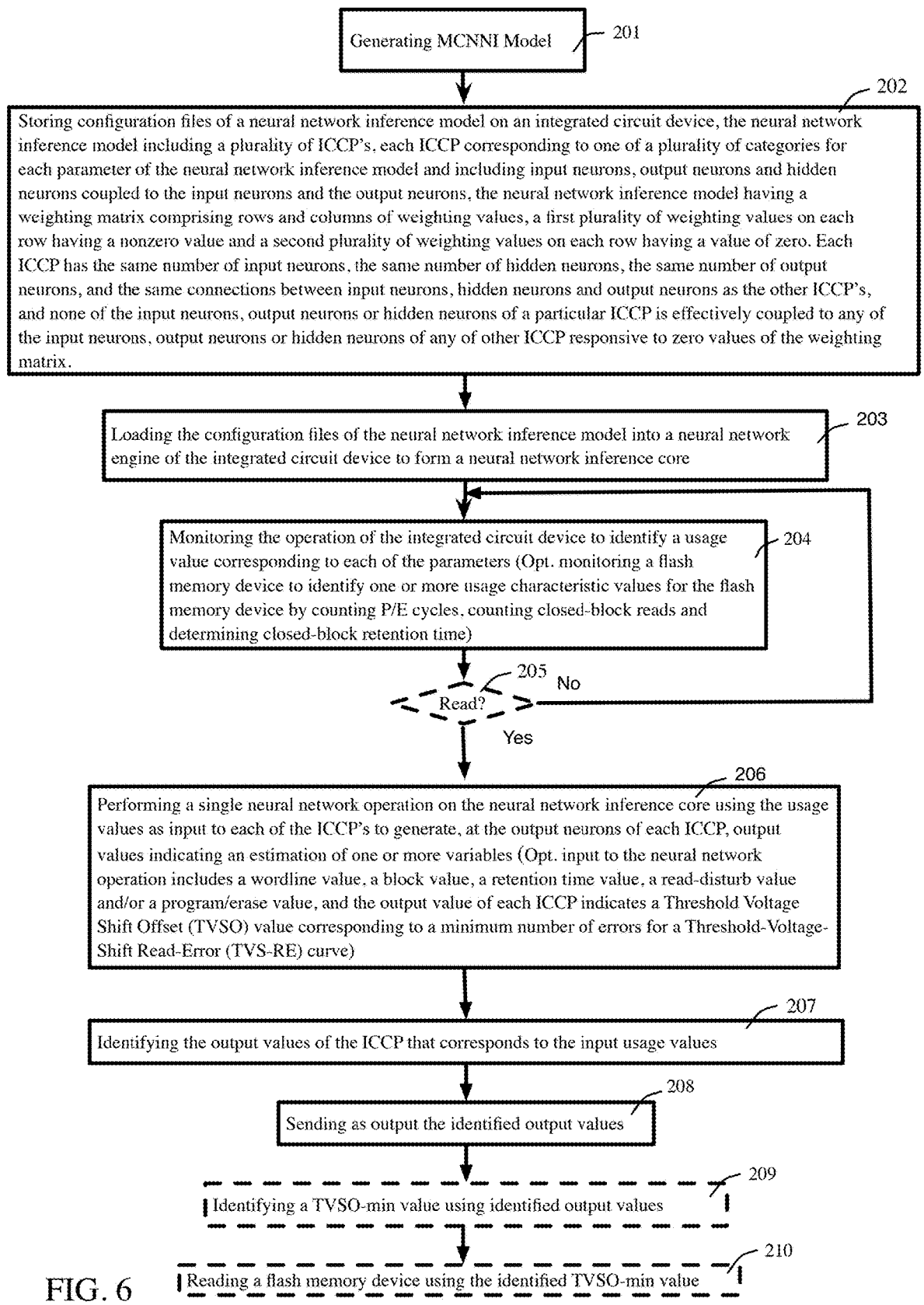
FIG. 6 is block diagram illustrating a method for performing a neural network operation on an integrated circuit device in accordance with an embodiment of the present invention.

FIG. 6 illustrates a method for performing an inference operation that includes generating an MCNNI model (201). The MCNNI model may be formed in accordance with method 100 of FIG. 1. The configuration files of the MCNNI model are stored (202) on an integrated circuit device. The MCNNI model generated (201) and stored (202) includes a plurality of ICCP's, each ICCP corresponding to one of a plurality of categories for each parameter of the neural network inference model and including input neurons, output neurons and hidden neurons coupled to the input neurons and the output neurons, the neural network inference model having a weighting matrix comprising rows and columns of weighting values, a first plurality of weighting values on each row having a nonzero value and a second plurality of weighting values on each row having a value of zero. Each ICCP has the same number of input neurons, the same number of hidden neurons, the same number of output neurons, and the same connections between input neurons, hidden neurons and output neurons as the other ICCP's, and none of the input neurons, output neurons or hidden neurons of a particular ICCP effectively coupled to any of the input neurons, output neurons or hidden neurons of any of other ICCP responsive to zero values of the weighting matrix. Physically a path may potentially exist between the input neurons, output neurons or hidden neurons of a particular ICCP and output neurons or hidden neurons of other ICCP's; however, due to the zero weighting values they are not effectively coupled.

The configuration files of the neural network inference model are loaded (203) into a neural network engine of the integrated circuit device to form a neural network inference core. The operation of the integrated circuit device is monitored (204) to identify a usage value corresponding to each of the parameters. A single neural network operation is performed (206) on the neural network inference core using the usage values as input to each of the ICCP's to generate, at the output neurons of each ICCP, output values indicating an estimation of one or more variable.

Optionally the neural network operation is performed in response to receiving a read instruction (205) at the integrated circuit device as will be further discussed below.

In the neural network operation, a corresponding input neuron of each core receives the same input as a corresponding input neuron of each other core. In the example shown in FIG. 4, input parameter values $X_0$, $X_5$, $X_{10}$, $X_{15}$, $X_{20}$ and $X_{25}$ each represent the same first usage value as input: input parameter values $X_1$, $X_6$, $X_{11}$, $X_{16}$, $X_{21}$ and $X_{26}$ each represent the same second usage value as input; input parameter values $X_2$, $X_7$, $X_{12}$, $X_{17}$, $X_{22}$ and $X_{27}$ each represent the same third usage value as input; and input parameter values $X_3$, $X_8$, $X_{13}$, $X_{18}$, $X_{23}$ and $X_{28}$ each represent the same fourth usage value as input, and input parameter values $X_4$, $X_5$, $X_{14}$, $X_{19}$, $X_{24}$ and $X_{29}$ each represent the same fifth usage value as input.

In the neural network operation, a corresponding output neuron of each core generates an output representing the same output variable as a corresponding output neuron of each other core. In the example shown in FIG. 4, output neurons 45 having output values $Y_0$, $Y_4$, $Y_8$, $Y_{12}$, $Y_{16}$ and $Y_{20}$ represent a generated first output variable, output neurons 45 having output values $Y_1$, $Y_5$, $Y_9$, $Y_{13}$, $Y_{17}$ and $Y_{21}$ represent a generated second output variable, output neurons 45 having output values $Y_2$, $Y_6$, $Y_{10}$, $Y_{14}$, $Y_{18}$ and $Y_{22}$ represent a generated third output variable and output neurons 45 having output values $Y_3$, $Y_7$, $Y_{11}$, $Y_{15}$, $Y_{19}$ and $Y_{23}$ represent a generated fourth output variable. In one example, the first output variable is a prediction of a first coefficient representing a curve, the second output variable is a prediction of a second coefficient of the curve, and so forth.

The output values of the ICCPs are identified (207) that correspond to the input usage values and the identified output values are sent (208) as output. Since each combination of categories is represented in a single ICCP, the ICCP corresponding to the input usage values may be determined by identifying which ICCP corresponds to the categories of each of the usage values input into the single neural network operation. In one example, a lookup table is stored that includes usage values for each category and corresponding index values identifying one of ICCP's. Step 207 includes performing a lookup operation using the usage values input into the single neural network operation to identify the corresponding ICCP.

In the example shown in FIG. 4, if the first usage value is within the first category and the second usage value is within the first category, the output of core $ICCP_{11}$ is identified in step 207 and output in step 208 (output values $Y_0$-$Y_3$), if the first usage value is within the first category and the second usage value is within the second category, the output of core $ICCP_{12}$ is identified in step 207 and output in step 208 (output values $Y_4$-$Y_7$).

Optionally, a minimum of a TVSO curve is identified-(TVSO-min value) is identified (209) using the identified output values and a read of a flash memory device will be performed (210) using the identified TVSO-min values as will be further discussed below.

Figure 7:
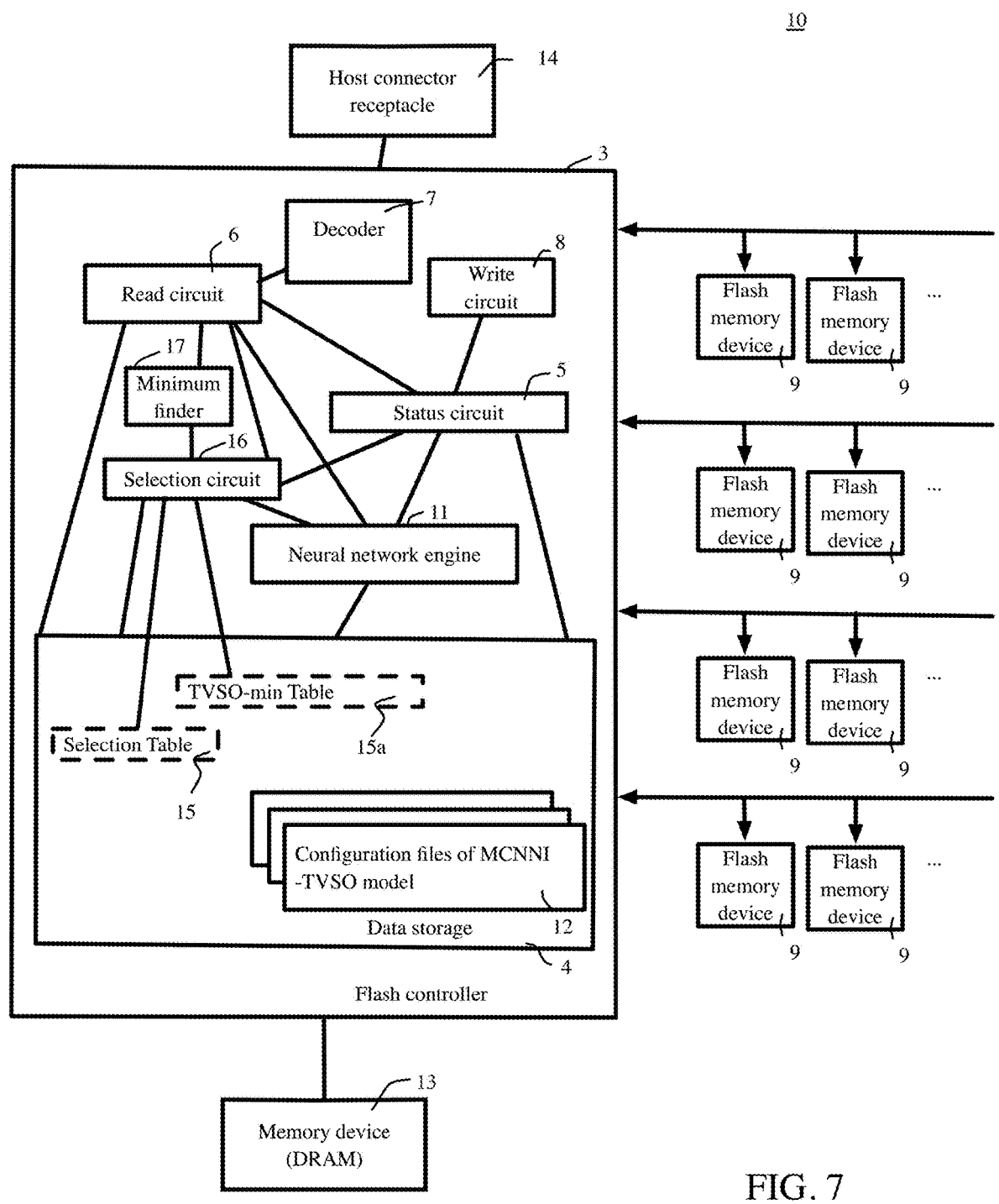
FIG. 7 is a block diagram illustrating an SSD in accordance with an embodiment of the present invention.

FIG. 7 shows an exemplary SSD 10 that includes a flash controller 3 coupled to a plurality of flash memory devices 9 for storing data. In the present embodiment, the flash memory devices 9 are NAND devices and SSD 10 includes one or more circuit boards onto which a host connector receptacle 14, flash controller 3 and flash memory devices 9 are attached. SSD 10 may also include one or more memory de e-devices 13 such as a Dynamic Random Access Memory (DRAM), that may be a separate integrated circuit device attached to a circuit board on which flash controller 3 is mounted, and electrically coupled directly to flash controller 3.

Flash controller 3 is configured to receive read and write instructions from a host computer through host connector receptacle 14, and to perform program operations, erase operations and read operations on memory cells of flash memory devices 9 to complete the instructions from the host computer. For example, upon receiving a write instruction from the host computer via host connector receptacle 14, flash controller 3 is operable to store data in SSD 10 by performing program operations (and when required, erase operations) to program codewords on to one or more flash memory e-devices 9.

Flash controller 3 includes a write circuit 8, a read circuit 6, a decoder 7, a status circuit 5, a minimum finder 17 and a data storage 4. Flash controller 3 also includes a neural network engine 11 coupled to the data storage 4 and a selection circuit 16. Flash controller 3 may optionally include one or more selection table tables 15 and a TVSO-min table 15a coupled to selection circuit 16, optionally included within data storage 4. Read circuit 6 is coupled to decoder 7, status circuit 5, selection circuit 16, data storage 4 and neural network engine 11. Status circuit 5 is coupled to write circuit 8, neural processing module 11, selection circuit 16 and data storage 4. Selection circuit 16 may be a dedicated circuit or may include a combination of software and hardware that is operable to communicate with one or more of data storage 4, status circuit 5, neural network engine 11 and read circuit 6. Minimum finder 17 is coupled to selection circuit 16 and to read circuit 6 may be a dedicated circuit or may include a combination of software and hardware. In one embodiment minimum finder 17 is a software program operable on a processor of controller 3 for receiving input and identifying a value corresponding to a minimum of a curve represented by the input. Configuration files for one or more MCNNI (e.g. MCNNI-TVSO) inference model 12 is included within data storage 4, which MCCNI model may be a TVSO model for reading flash memory devices 9. In one example, neural network engine 11 includes specialized hardware module (e.g., a specialized configurable accelerator) specifically configured to perform a neural network operation.

Figure 8:
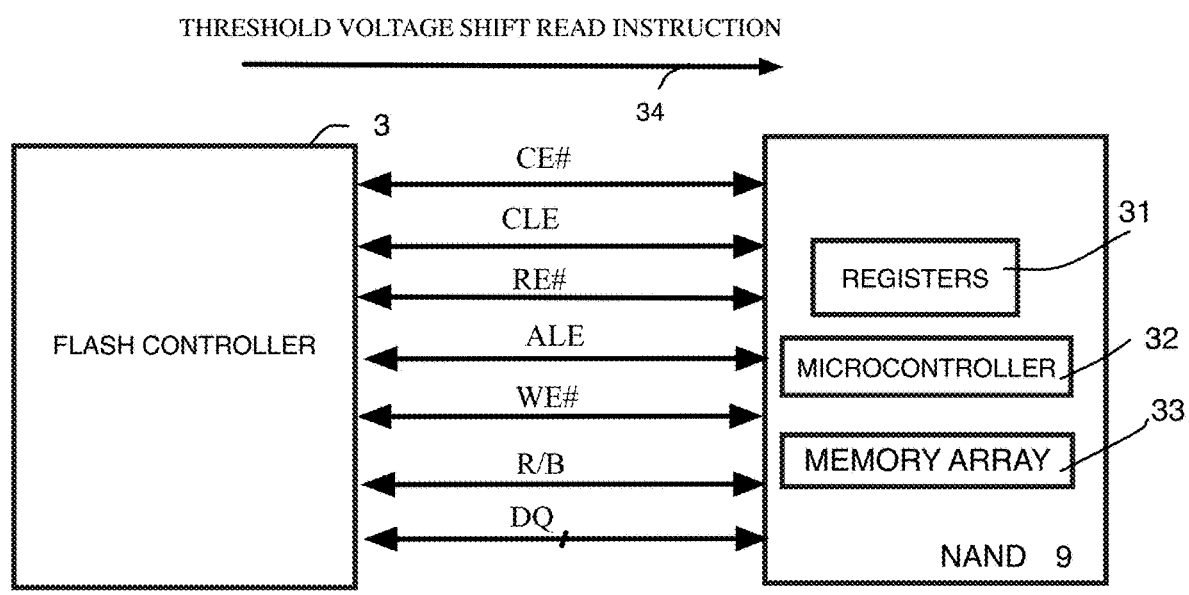
FIG. 8 is a diagram illustrating a flash controller and an exemplary NAND flash memory device and illustrates the communication between the flash controller and the flash memory device in accordance with an embodiment of the present invention.

Each flash memory device 9 may be a packaged semiconductor die or "chip" that is coupled to flash controller 3 by conductive pathways that couple instructions, data and other information between each flash memory device 9 and flash controller 3. In the embodiment shown in FIG. 8, each flash memory device 9 (e.g., a NAND device) includes registers 31, a microcontroller 32 and a memory array 33, and is coupled to flash controller 3 by a chip enable signal line (CE #), a command latch enable signal line (CLE), a read enable signal line (RE #), an address latch enable signal line (ALE), a write enable signal line (WE #), a read/busy signal line (R/B) and input and output signal lines (DQ).

Upon receiving a write instruction from a host computer, write circuit 8 is operable to encode received data into a codeword that is sent to registers 31 along with a corresponding program instruction. Microcontroller 32 is operable to perform the requested write instruction and retrieve the codeword from register 31 and store the codeword in memory array 33 by programming cells of memory array 33 (e.g., as a logical page).

In one example, each flash memory device 9 includes NAND memory cells that are organized into blocks and pages, with each block composed of NAND strings that share the same group of wordlines. Each logical page is composed of cells belonging to the same wordline. The number of logical pages within each logical block is typically a multiple of 16 (e.g. 64, 128). In the present embodiment, a logical page is the smallest addressable unit for reading from, and writing to, the NAND memory cells of each flash memory device 9 and a logical block is the smallest erasable unit. However, it is appreciated that in embodiments of the present invention, programming less than an entire logical page may be possible, depending on the structure of the NAND array. Though flash memory devices 9 are illustrated as being NAND devices, it is appreciated that flash memory devices 9 may be any type of memory storage device that uses a threshold voltage for reading memory cells of the flash memory device 9.

In response to receiving a read instruction from the host computer, read circuit 6 is configured to perform a read of a respective flash memory device 9 using a threshold-voltage-shift read operation. More particularly, read circuit 6 is operable to send a threshold-voltage-shift read instruction 34 to flash memory device 9. Microcontroller 32 reads the respective memory array 33 in response to the threshold-voltage-shift read instruction and outputs the read results at registers 31. The read results are sent to decoder 7 that is operable to decode the read results to obtain the stored codeword.

Flash memory devices 9 may be SLC, MLC, TLC or QLC NAND devices. In the present embodiment flash memory devices 9 are capable of performing a wide range of threshold-voltage-shift reads, including reads specified by whole number offset values such as −n . . . −2, −1, 0, +1, +2, . . . n, without limitation.

An erased block of a flash memory device 9 may be referred to as a "free block." When data are programmed into a block that has been erased the block is referred to as an "open block" until all pages of the block have been programmed. Once all pages of the block have been programmed the block is referred to as a "closed block" until it is again erased.

Flash Controller Example—Generating the MCNNI Model

Figure 9:
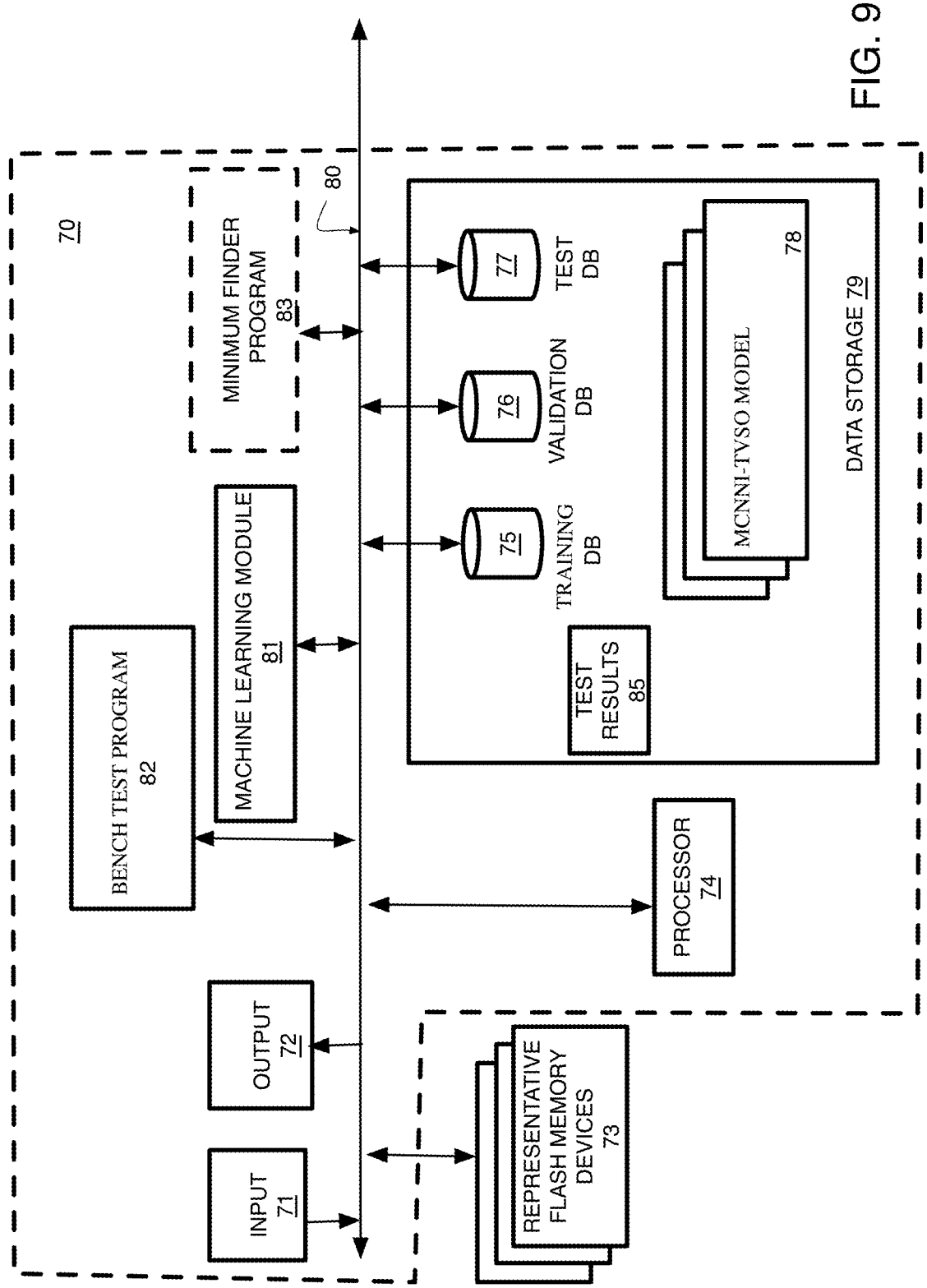
FIG. 9 is a diagram illustrating a testing and model generation system in accordance with an embodiment of the present invention.

Following is an example in which method 100 is used to generate an MCNNI model that can be used for selecting TVSO values for performing reads of flash memory devices 9, that may be referred to hereinafter as a "MCNNI-TVSO inference model". The method is illustrated with reference to system 70 of FIG. 9. However, it is appreciated that the MCNNI-TVSO inference model could also be generated by flash controller 3. System 70 includes an input 71, an output 72, a processor 74, a data storage 79 and a minimum finder program 83 that are coupled together via a network 80. Minimum finder program 83 is a software program operable on processor 74, and may thus represent electronically readable instructions, that is operable to identify a minimum value of a function. Test and model generation system 70 includes a bench test program 82, coupled to network 80, which may represent electronically readable instructions, that is operable on processor 74 for testing representative flash memory devices 73 in such a way as to identify the number of errors that occur as the representative flash memory devices 73 age. Representative flash memory devices 73 may be inserted into one or more test fixtures that couples couple to test and model generation system 70, and may particularly couple to network 90. Representative flash memory devices 73 are devices that are similar to, or identical to, flash memory devices 9, and may be the same type of device (e.g. the same type of NAND device), made by the same manufacturer as flash memory devices 9. Machine learning module 81, coupled to network 80, may represent electronically readable instructions that are operable on processor 74 for generating the neural network, and may include a computer program operable on processor 74.

The architecture of the neural network inference model is received as input (101) and the plurality of different categories are received as input (102) through input 71 and temporarily stored in data storage 79. In the present embodiment, the plurality of categories for each parameter span the full range of values expected to be received as input to the inference operation relating to the particular parameter. Machine learning module 81, coupled to network 80, is operable to generate the initial MCNNI-TVSO inference model in step 103, and the architecture input into machine learning module 81 controls the generation and testing of machine learning module 81 during the process of steps 103-118.

In one embodiment, parameters include a parameter indicating a wordline of a flash memory device (a wordline value), a parameter indicating a block of a flash memory device (a block value), a parameter indicating a retention time of a flash memory device (a retention time value), a parameter indicating a number of read disturbs of a flash memory device (a read-disturb value) and a parameter indicating the number of program and erase cycles of a flash memory device (a program/erase value). In this example, each categorized-core-portion corresponds to a category of wordline values, a category of block values, a category of retention time values, a category of read-disturb values or a plurality of periods in the life of a flash memory device (e.g., indicated by program/erase value).

Wordlines are grouped by their physical location on the chip and the boundaries between different groups are determined by running a test on exemplary semiconductor devices in a test lab to identify a custom defined metric that relates to errors of TVSO values. In an embodiment illustrated in FIG. 10 it can be seen that there are discontinuities in the test results. In the present example categories are selected such that category boundaries correspond to the discontinuities. A first group of wordlines 51 includes wordlines 1-30; a second group of wordlines 52 that includes wordlines 31-80; a third group of wordlines 53 that-includes wordlines 81-195; a fourth group of wordlines 54 includes wordlines 196-220; a fifth group of wordlines 55 that includes wordlines 221-250; and a sixth group of wordlines 56 includes wordlines 250-$n$, where n is the total number of wordlines. Accordingly, wordlines are divided into six different wordline categories.

In one example, block categories group blocks by their physical location on the chip (e.g., n adjoining blocks are a first category, then the next n adjoining blocks are a second category, and so on), with blocks divided into five different block categories. In one exemplary embodiment in which SSD 10 includes 128 flash memory devices 9, each of which includes 2048 blocks, blocks may be assigned block numbers 0 through 262,143 with the block value input into the single neural network operation being the block number of a page that is to be read (e.g., when a read is to be performed as shown in step 205).

Retention time is grouped into different periods based on closed-block retention time, with some or all periods having the same duration. In one example retention time is grouped into 50 periods, with each period having a duration of 40 hours (e.g., a first group has a closed-block retention time less than or equal to 40 hours, a second group has a closed-block retention time of greater than 40 hours and less than or equal to 80 hours, a third group has a closed-block retention time of greater than 80 hours and less than or equal to 120 hours, and so on).

Read disturb is categorized based the number of closed-block reads of the block that is to be read. In one example read disturb is divided into four categories, with a first category including from 0 to 100,000 closed-block reads, a second category including from 100,001 to 200,000 closed-block reads, a third category including from 200,001 to 300,000 closed-block reads and a fourth category that is more than 300,001 closed-block reads.

In one example the lifetime of the flash memory device is grouped into periods based on the number of program and erase cycles and a category is generated for each of the periods. In one example, the periods in the life of the flash memory device are divided into seven different categories, a first category for the first 1,000 P/E cycles, a second category that is 1,001 P/E cycles to 2,000 P/E cycles, a third category that is 2,001 P/E cycles to 3,000 P/E cycles, a fourth category that is 3,001 P/E cycles to 4,000 P/E cycles, a fifth category that is 4,001 P/E cycles to 5,000 P/E cycles, a sixth category that is 5,001 P/E cycles to 6,000 P/E cycles, a seventh category that is 6,001 P/E cycles to 7,000 P/E cycles (which is the end of life of the SSD).

In the present example, step 103 generates an initial neural network inference model that is a regression neural network model, that includes ICCP's that generate output identifying a curve represented by the parameters. In one embodiment, the definition of ICCP's in the model is done in an automated manner by machine learning model 81 to define the ICCP's in the initial MCNNI-TVSO model.

Figure 11:
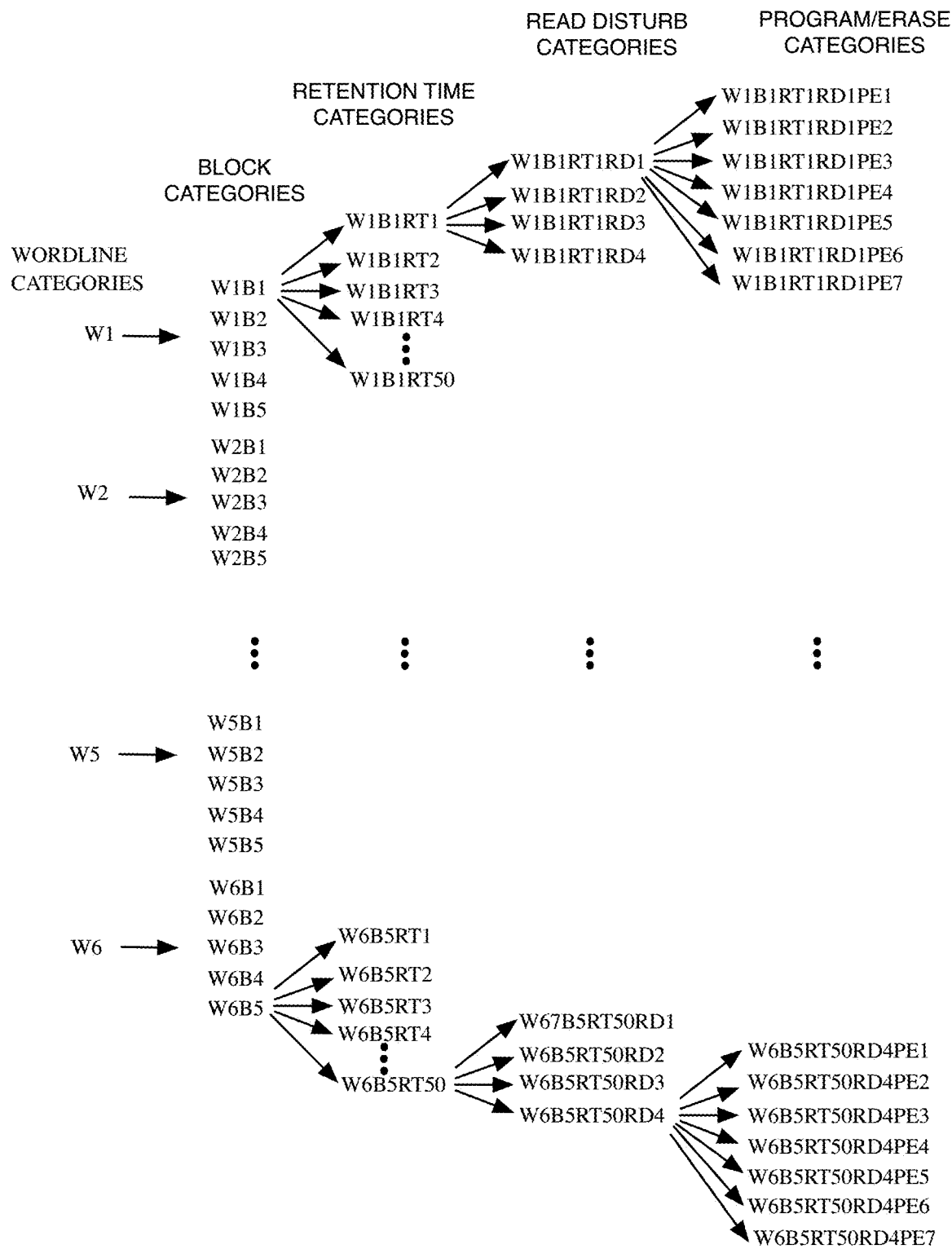
FIG. 11 is a diagram illustrating categories for an MCNNI model in accordance with an embodiment of the present invention.

FIG. 11 illustrates the ICCP's of an exemplary MCNNI-TVSO model and how the ICCP's are generated. In this example, there are six wordline categories shown as W1-W6 and there are five block categories, shown as B1-B5, fifty retention time categories shown as RT1-RT50, four read disturb categories shown as RD1-RD4 and seven program/erase categories shown as PE1-PE7. It can be seen that there are a large number of combinations of these categories, each of which is implemented as an ICCP of the respective MCNNI-TVSO model. The last column represents each of the ICCP's in the MCNNI-TVSO model. More particularly the MCNNI-TVSO model includes a first core portion, shown as W1B1RT1RD1PE1 (the first category of each parameter), a second core portion W1B1RT1RD1PE2 which is the first category of each of the first four parameters and the second program/erase category, a third core portion W1B1RT1RD1PE3 which is the first category of each of the first four parameters and the third program/erase category, and so forth so that each possible combination of categories comprises an ICCP. It is appreciated that only the first and last category of each parameter is expanded in this illustration and that all categories will be expanded in the same manner to form ICCP's.

Figure 12:
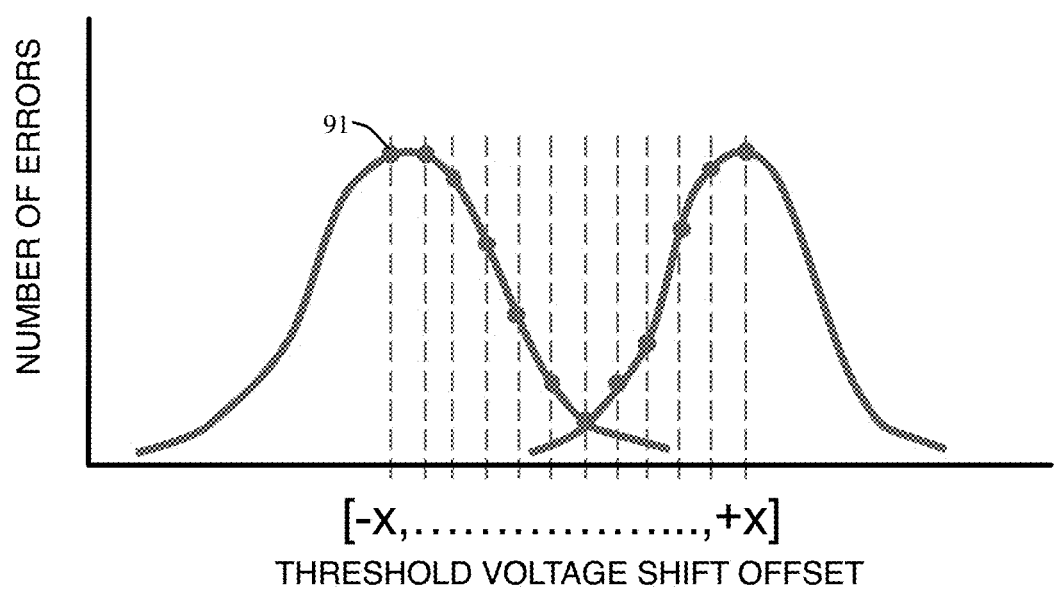
FIG. 12 is a graph illustrating a number of errors on the vertical axis and threshold voltage shift offset on the horizontal axis that illustrates errors in reading an exemplary flash memory device in accordance with an embodiment of the present invention.

In optional step 104 flash characterization testing is performed on representative flash memory devices 73 to obtain one or more sets of threshold-voltage-shift read test results. Numerous representative flash memory devices 73 are tested under varying conditions to obtain one or more sets of threshold-voltage-shift read test results 85 that may be stored in data storage 79. The set(s) of test results represent different characterized points or periods in the lifetime of a characterized flash memory device and different operating conditions of the characterized flash memory device as a result of different testing conditions applied during the testing of flash memory devices 73. FIG. 12 illustrates a graph representing exemplary flash characterization testing for an exemplary memory cell that illustrates different TVSO values on the x-axis and the number of errors on the y axis. The result of this process, i.e. the collection of the number of errors at different VT-shift values (dots 91), is a curve, where a portion of the curve is shaped like a "valley." The MCNNI-TVSO inference model 78 of the present invention generates output that predicts a curve that includes this valley for each of the conditions simulated during the testing of step 104.

In one example step 104 of FIG. 1 includes performing tests on representative flash memory devices 73 that identify a number of errors at each of a plurality of different threshold voltage shift offsets, in which the following variables are used in the testing: a REFERENCE VALUE of the respective representative flash memory device 73 that is being tested, a BLOCK VALUE identifying the block of the page that was read in the test, a WORDLINE VALUE indicating a wordline of the page that was read in the test, a READ DISTURB VALUE indicating the number of closed-block reads of the block containing the page that was read in the test, a RETENTION TIME VALUE indicating the closed-block retention time of the block containing the page that was read in the test and a PROGRAM/ERASE VALUE of the block containing the page that was read in the test.

Figure 13:
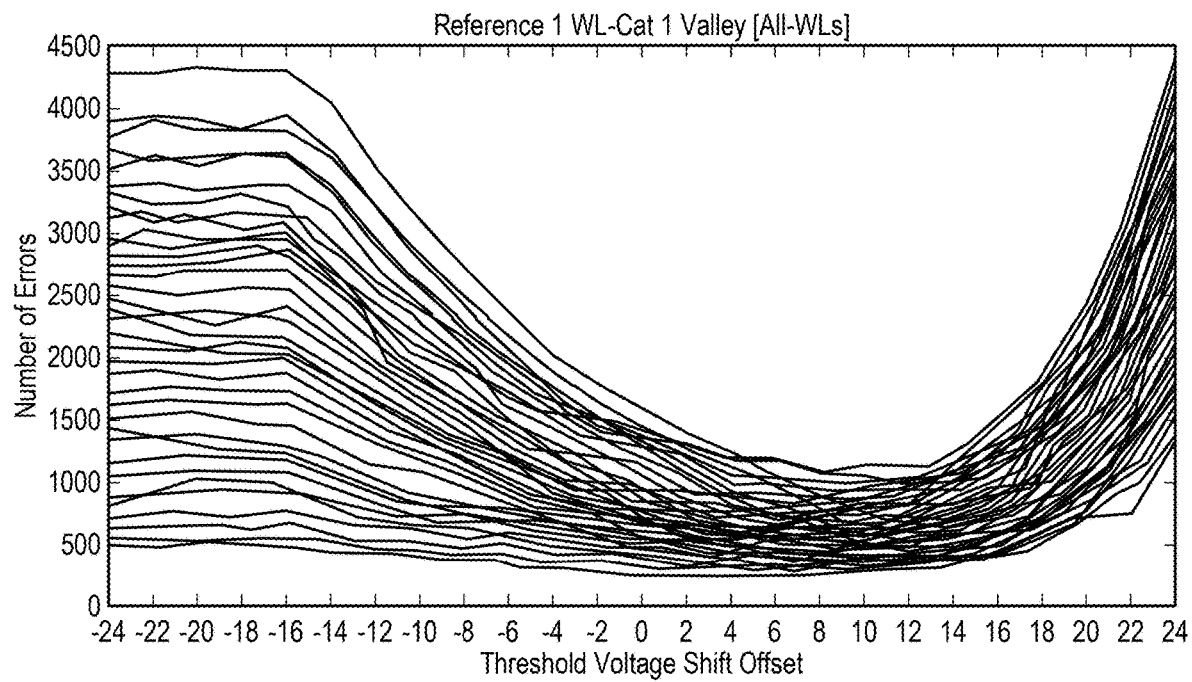
FIG. 13 is a graph illustrating exemplary threshold-voltage-shift read-error curves generated from an exemplary threshold-voltage shift-read training data set in accordance with an embodiment of the present invention.
Figure 14:
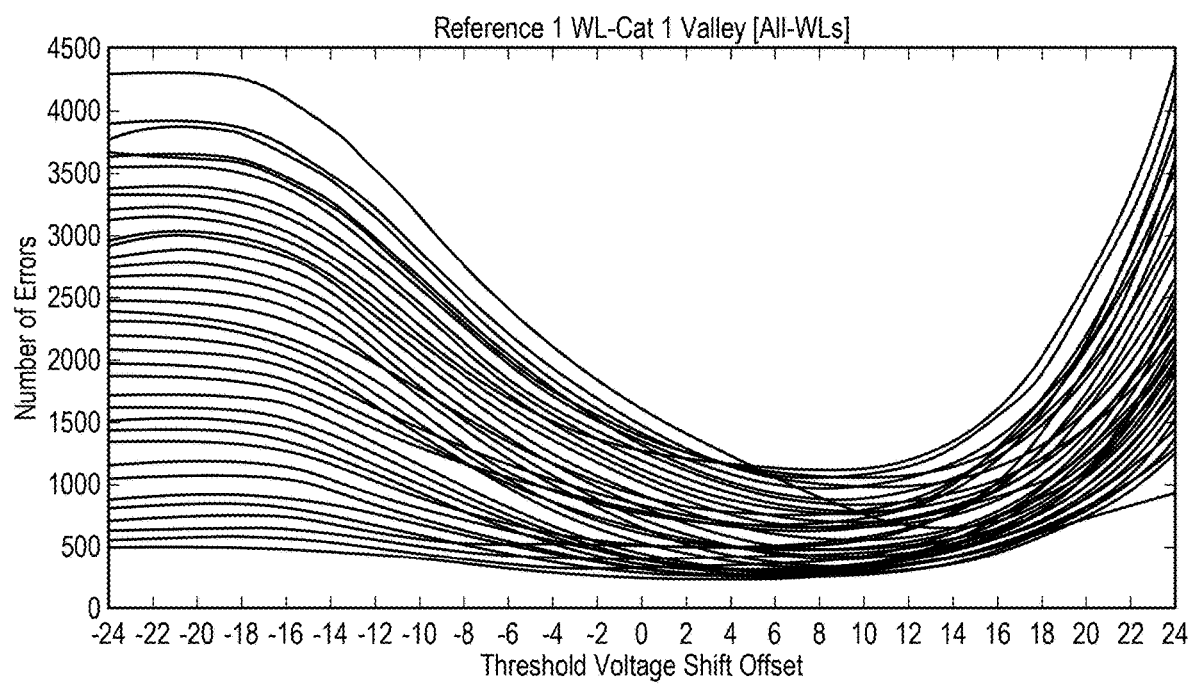
FIG. 14 is a graph illustrating exemplary smoothed threshold-voltage-shift read-error curves generated from an exemplary smoothed threshold-voltage shift-read training data set in accordance with an embodiment of the present invention.

In step 105 data records are received that indicate the results of the tests on representative flash memory devices 73. In one example, threshold-voltage-shift read test results 85 are received (e.g. they are received at input 71 or machine learning module 81 retrieves them from data storage 79). FIG. 13 shows an example of TVS-RE curves generated from an exemplary threshold-voltage shift-read training data set. More particularly, the number of errors is shown on the y-axis and TVSO is shown on the x-axis. As can be seen in FIG. 13, because of the nature of the NAND flash read circuitry there are fluctuations (noise) in the number of errors of each valley. This noise negatively impacts the learning process of the MCNNI-TVSO inference model which may impact the actual position of the minimum of the valley and lead to calculation of incorrect TVSO values. To avoid this problem, a smoothing algorithm such as a moving average or multi-polynomial interpolation is optionally applied to the training data set, as is shown by step 106, prior to training to generate a smoothed threshold-voltage-shift-read training data set (where the shape of the valleys represented by the target data set are smoothed). FIG. 14 shows an example of TVS-RE curves generated from an exemplary smoothed threshold-voltage shift-read training data set. Accordingly, because the smoothing function (106) is performed prior to training, the MCNNI-TVSO inference model is not trained to predict the TVS-RE curve (e.g., rebuilt the "valley") corresponding to the exact number of errors measured during the device's characterization, but rather is trained to predict the TVS-RE curve (e.g., rebuild the "valley") corresponding to the smoothed threshold-voltage-shift-read training data set.

In one example, the training data set, the validation data set and the test data set include flash memory device characterization test results that indicate the number of errors in reads performed at different threshold-voltage-shift-offset values. In one example, machine learning module 81 is operable to separate (e.g., by a random process) the threshold-voltage-shift read test results 85 into a training database 75 that includes a threshold-voltage-shift-read training data set, a validation database 76 that includes a threshold-voltage-shift-read validation data set and a test database 77 that includes a threshold-voltage-shift-read test data set, each of which are coupled to network 80.

Figure 10:
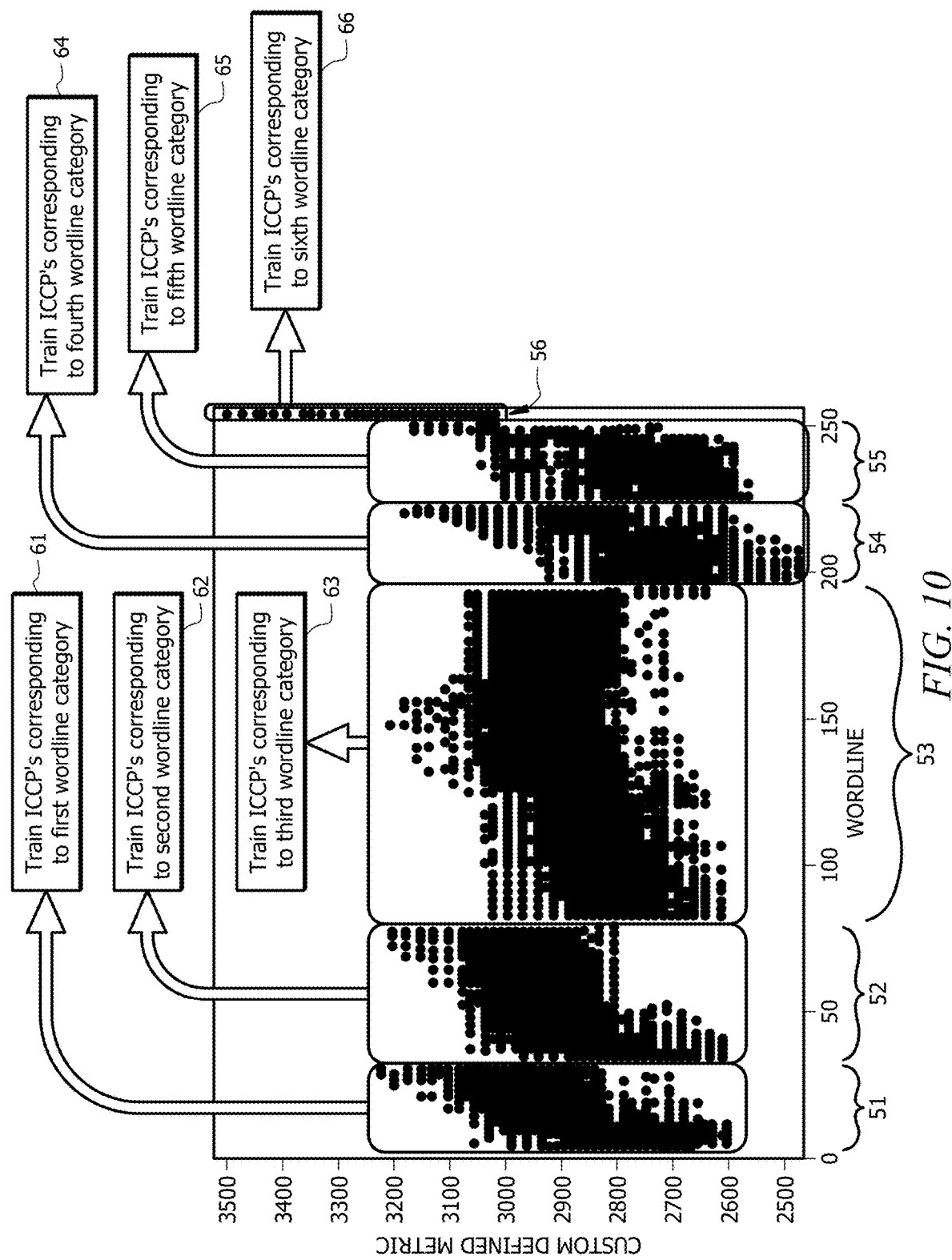
FIG. 10 is a diagram illustrating wordline categories for an MCNNI model in accordance with an embodiment of the present invention.

In the present example, the first wordline category is selected in step 108 of FIG. 1 and a data record is selected in step 109 that includes a wordline value within the limits of the first wordline category (e.g., a data record having a wordline of 1-30) and a backpropagation algorithm is performed (110) on data input into input neurons 41 to train the ICCP as shown by block 61 of FIG. 10. The data record may include a number of errors for a read operation of an exemplary flash memory device, a WORDLINE VALUE identifying the wordline that was read, a BLOCK VALUE indicating the block number of the block containing the page that was read, a READ DISTURB VALUE indicating the number of closed-block reads of the block containing the page that was read, a RETENTION TIME VALUE indicating the closed-block retention time for the block containing the page that was read and a PROGRAM/ERASE value indicating a current number of program and erase cycles of the block containing the page that was read. The backpropagation algorithm may be a regression algorithm that generates a curve representing the errors at different TVSO values.

Once all data records having a wordline value within the limits of the first wordline category have been processed, the process moves to the second wordline category and the backpropagation algorithm is performed on data records that include a wordline value within the limits of the second wordline category (e.g., a data record having a wordline of 31-80) as shown by block 62. Once all data records having a wordline value within the limits of the second wordline category have been processed, the process moves to the third wordline category and the backpropagation algorithm is performed on data records that include a wordline value within the limits of the third wordline category as shown by block 63. The backpropagation algorithm is performed on data records that include a wordline value within the limits of the fourth wordline category as shown by block 64, the backpropagation algorithm is performed on data records that include a wordline value within the limits of the fifth wordline category as shown by block 65 and then the backpropagation algorithm is performed on data records that include a wordline value within the limits of the sixth wordline category as shown by block 66. Once training has been performed using all wordline categories, data records that include block values within the limits of each category of block values are used to perform training. The process continues in the same manner until all block categories have been trained. Training is then performed in the same manner for each retention time category, each read disturb category and each P/E category.

In the testing of step 113 inference operations are performed using data records in the threshold-voltage-shift-read training data set and an error function, such as a Min-Squared-Error (MSE) function, without limitation, is used to identify the error achieved by training using the threshold-voltage-shift-read training data set.

When the trained MCNNI-TVSO inference model meets predetermined training criteria (114-115) the MCNNI-TVSO inference model is validated using the threshold-voltage-shift-read validation data set, stored in validation database 76, by performing inference operations using data records in the threshold-voltage-shift-read validation data set and computing the error function on the results. When the error computed by the error function is below a predetermined threshold the MCNNI-TVSO model is tested by performing inference operations using data records in the threshold-voltage-shift-read test data set, stored in test database 77. The output of the MCNNI-TVSO model generated using the test data set is compared to optimal threshold voltage shift values (that may be referred to as "golden VT-opt" values) that are calculated without using the MCNNI-TVSO model (e.g., are calculated by generating error curves using the test bench program 82 and using minimum finder program 83 to identify golden VT-opt values for the various testing samples). The method passes to step 117 when the predicted TVSO-min values calculated using MCNNI-TVSO model are within a range of the corresponding golden VT-opt values.

Optionally, a floating point conversion is performed (117) by converting the configuration files of the MCNNI-TVSO model from floating point to fixed point (e.g. 40 bits fixed point) to speed up the inference time of the resulting final MCNNI-TVSO model. In one example, step 117 produces configuration files of MCNNI-TVSO model 78 shown in FIG. 9. The conversion from floating point to fixed point enables a neural network engine 11 with a lower gate count and reduces latency.

Configuration files of the trained, validated and tested neural network inference model are stored (118). In one example a trained, validated and tested neural network inference model 78 is stored in data storage 79 in the form of configuration files. Generation of the MCNNI model may be performed prior to sale and use of a SSD 10 and prior to delivery of a flash controller 3 to a customer for use in fabrication of a SSD 10 or it may be performed on SSD 10. If it is performed prior to sale and use of a SSD 10 and prior to delivery of a flash controller 3 to a customer for use in fabrication of a SSD 10, it may be performed using a testing and model generation system, as will be discussed in more detail below.

Flash Controller Example—Method 200 and SSD 10

Following is an example of method 200 that illustrates the operation of SSD 10. In this example, a MCNNI-TVSO model is generated (201) and the configuration files for the MCNNI-TVSO model are stored (202) in data storage on flash controller 3 as configuration files 12 or on a memory device 13 that is coupled to the flash controller 3, preferably prior to delivery of flash controller 3 to a customer. Configuration files of the MCNNI-TVSO model are loaded (203) into neural network engine 11 to form a MCNNI-TVSO core.

In step 204, status circuit 5 is operable to monitor the operation of each flash memory device 9 to identify one or more usage values of flash memory devices 9. The determined usage values may be stored in registers of flash controller 3, in data storage 4 of flash controller 3 or in memory device 13. In this example, the usage values are values determined during usage of a flash memory device 9 that can affect threshold voltage distribution Usage values may include, a value indicating the wordline of the location that is to be read, a value indicating the block of the location that is to be read, a value indicating the current age/physical degradation of the location that is to be read (e.g., the number of P/E cycles or Bit Error Rate (BER)) and one or more values indicating the current transitory characteristics of the location that is to be read (e.g., closed-block read disturb and closed-block retention time).

The usage values may include a read disturb value. In one example, each time that a block is closed, status circuit 5 is operable to count the number of reads of the block while the block is closed and the number of reads of the block while the block is closed is stored as a read disturb value. When a block is erased the read disturb value of the erased block is reset to zero.

The usage values may include a closed-block retention time. In one example, each time that a block is closed, status circuit 5 is operable to start a timer to determine the amount of time that has elapsed since the block was closed. The elapsed time as determined by the timer at any point in time is defined as a closed-block retention time value. When a block is erased the timer for that block is stopped and the closed-block retention time value of the erased block is reset to zero.

The usage values may include a number indicating the number of program and erase operations of each block. In one example, status circuit 5 is operable for counting the number of program and erase cycles of each block of the flash memory device during the entire lifetime of the flash memory device and storing the count in data storage 4 or memory device 13, which may be a dynamic read access memory (DRAM).

The usage values may also include a BER of a block or a group of blocks. In one example, status circuit 5 is operable to periodically determine a BER of each block and the BER for each block is stored as a BER value. In one example, each time that a BER value is calculated, it is stored in data storage 4 or memory device 13 so as to overwrite a previously stored BER value for the particular block.

A single neural network operation is performed (206) by neural network engine 11. Optionally, the single neural network operation is performed in response to receiving a read instruction (205). In one example, upon receiving a read instruction indicating a read address corresponding to memory cells of the flash memory device, status circuit 5 is configured to identify one or more usage values corresponding to the memory cells that are to be read.

In step 206 the single neural network operation is performed on the MCNNI-TVSO core using the usage value as input to each of the ICCP's to generate, at the output neuron of each ICCP, an output value indicating an estimation of the variable.

The output values of the categorized-core-portions corresponding to the input usage values are identified (207) and are sent as output (208). In one example, selection circuit 16 is operable for performing steps 207-208. In one embodiment, selection circuit 16 comprises a processor that is operable for performing instructions so as to perform a lookup in selection table 15 using the input usage values to identify the core portion corresponding to the input usage values, and identify the corresponding output values that are coupled as output either to data storage 4, to minimum finder 17, or to read circuit 6. In this example, selection table 15 includes input usage values and index values identifying corresponding core portions, and selection circuit 16 looks up the index value indicating the core portion to use. The index values is are then used to obtain the corresponding output values, by receiving all output values (all ICCP's from the operation of step 206) from neural network engine 11 and outputting only the output values corresponding to the identified core portion. Alternatively, upon completion of the neural network operation of step 206, the output of all ICCP's is stored in data storage 4 and selection circuit 16 reads the output values of the ICCP corresponding to the identified core portion.

In one example, the mathematical equation solved by each categorized-core-portion to generate the output value are equivalent and the values of the first plurality of weighting values are not the same for each categorized core portion, such that the output value indicating an estimation of the variable corresponds to the first plurality of weighting values for each categorized core portion. In one example the input neurons of each independent categorized core portion are identical to the input neurons of each of the other independent categorized-core-portions and are configured to receive the same usage values as the input neurons of each of the other independent categorized-core-portions.

When the output indicates coefficients of a TVSO-RE curve or the amount of error TVSO values, minimum finder program 83 is operable (e.g., by running the program on a processor of flash controller 3) in step 209 to find the minimum point of the curve and identify the TVSO-min corresponding to the identified minimum point in the curve.

In step 210 a flash memory device is read using a threshold-voltage-shift read operation performed using the identified TVSO-min. The single neural network operation of step 206 is performed each time that a read instruction is received from a host computer. More particularly, in response to receiving a read instruction at host connector receptacle 14, steps 206-209 are performed so as to generate a TVSO-min value and read circuit 6 uses the TVSO-min value identified in step 209 to perform the read of step 210.

In another example, steps 206-209 are performed by flash controller 3 in the background, without any trigger from the host. In this example, steps 206-209 are performed by flash controller 3 upon an internal controller event such as an event by a timer or a counter (e.g., a background read) to monitor the reliability state of the flash memory devices 9 and the TVSO-min values identified in step 209 are stored in a table. In one example, selection circuit 16 is operable to store the values in table 15a that includes usage characteristics and corresponding TVSO-min values (that may be referred to as a "TVSO-min table"). In this example, when the read instructed in step 205 is to be performed, the usage values are identified (step 204) and the identified usage values are used by selection circuit 16 to look up the corresponding TVSO-min value to use in the read. Alternatively, the look-up process can be performed by read circuit 6.

In one example, each ICCP corresponds to a single category of wordline values, a single category of block values, a single category of retention time values, a single category of read-disturb values and a single value indicating a period in the life of a flash memory device, and a first input neuron of each ICCP is configured to receive a wordline value, a second input neuron of each ICCP is configured to receive a block value, a third input neuron of each ICCP is configured to receive a retention time value, a fourth input neuron of each ICCP is configured to receive a read-disturb value and a fifth input neuron of each ICCP is configured to receive a program/erase value.

In one example, the output generated at each output neuron of an ICCP can be represented by a mathematical equation that includes a variable corresponding to the value provided to each input neuron of the ICCP, weighting values and bias values, where the output neurons of each particular ICCP solve the same equations as the output neurons of the other ICCPs such that the only difference between the output of different ICCPs is a result of different weighting values and bias values of the particular ICCP.

Figure 15:
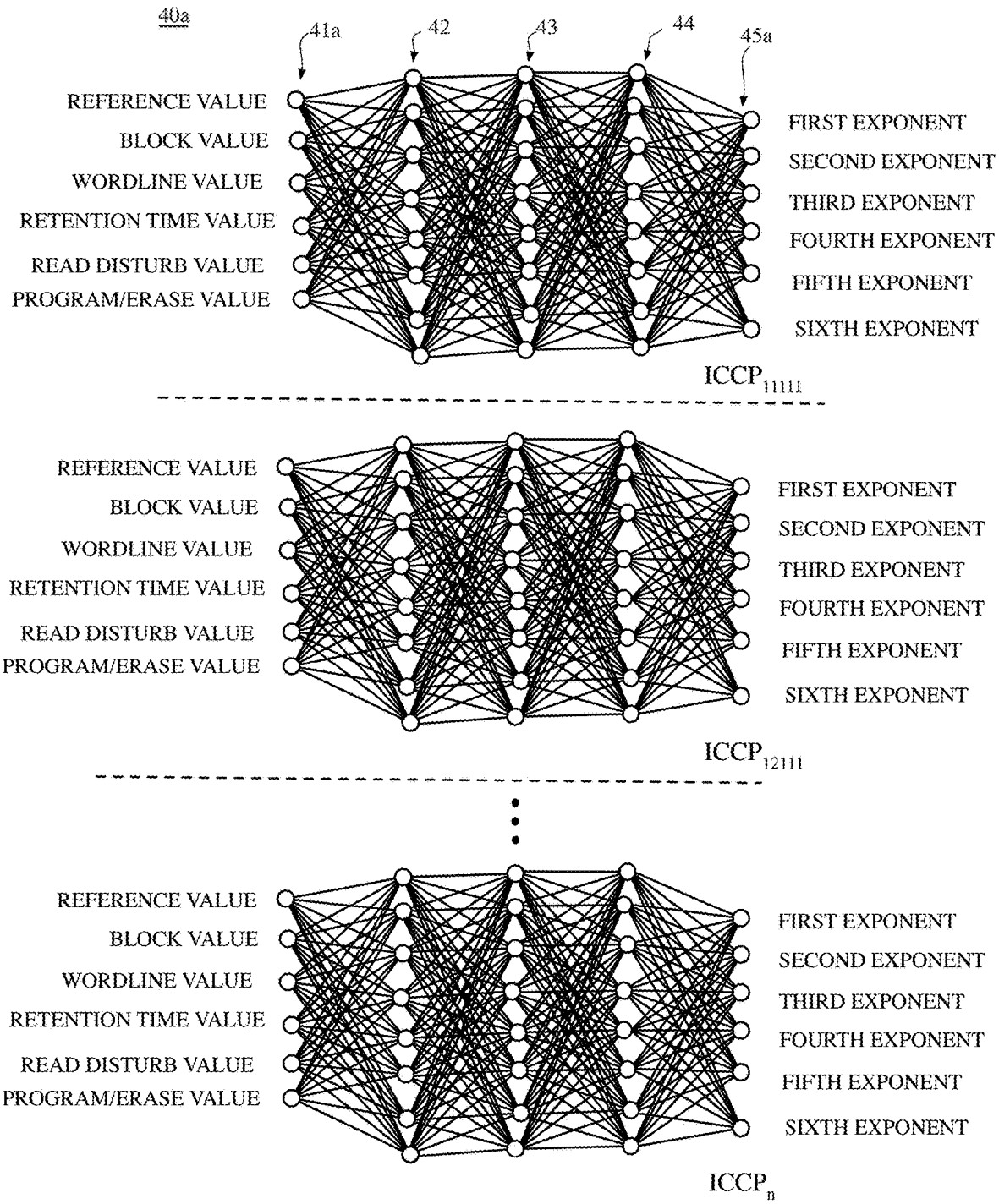
FIGS. 15-19 are diagrams illustrating a multi-category neural network inference model in accordance with embodiments of the present invention.

FIG. 15 shows a diagram of an exemplary inference model 40a that includes a plurality of input neurons 41a, a plurality of output neurons 45a and layers 42-44 of hidden neurons. The input parameter values for the inference model 40a includes a reference value (REFERENCE VALUE). In one embodiment the reference value is an identifying value that identifies one or more characteristics of the flash memory device that is to be read, such as, for example, a manufacturer, a part number, and/or a manufacturing lot number, without limitation. By including a reference value identifying the type of flash memory device, an inference model can be used that can identify a TVS-RE curve for different types of flash memory devices. In another embodiment, the reference value is a read reference number that is a number specified by the manufacturer of the flash memory device that indicates which read reference voltage is to be used to read a page. For example, in one type of Flash memory device, read reference numbers 1 and 5 are associated with the lower page, references 2, 4 and 6 are associated with the middle page, and 3 and 7 are associated with the upper page. In one example the read reference number is one or more values identifying a read reference voltage that is used to perform a read (e.g., the read reference number(s) corresponding to a particular read operation).

The input parameter values further include one or more values identifying a page that is to be read, which in this example includes a BLOCK VALUE identifying the block of the page that is to be read in step 205 and a WORDLINE VALUE indicating a wordline of the page that is to be read. In one exemplary embodiment in which SSD 10 includes 128 flash memory devices 9, each of which includes 2048 blocks, blocks may be assigned block numbers 0 through 262, 143 with the BLOCK VALUE being the block number of the page that is to be read in step 205.

In this example, step 204 includes counting a number of closed-block reads, and an input parameter value for the neural network operation includes a value indicating the number of closed-block reads of the block containing the page that is to be read (i.e. READ DISTURB VALUE). Step 204 also includes determining a closed-block retention time, the input for the neural network operation including a value indicating the closed-block retention time of the block containing the page that is to be read (i.e. RETENTION TIME VALUE). In addition, step 204 includes counting a number of program and erase cycles of each block of the flash memory device, and the current point in the lifetime of the flash memory device is determined to be a current number of program and erase cycles of the block containing the page that is to be read (i.e. PROGRAM/ERASE VALUE).

Output neurons 45a generate output in the form of exponent values that define a TVS-RE curve. The exemplary output of inference model 40a is shown to include six exponents, shown as FIRST EXPONENT, SECOND EXPONENT, THIRD EXPONENT, FOURTH EXPONENT, FIFTH EXPONENT and SIXTH EXPONENT. It is appreciated that the inference model 40a may have any number of exponents, and that the number of exponents may be altered to achieve a balance between processing time and accuracy. In this embodiment, in step 209 the exponents are coupled to minimum finder 82, that is operable to receive as input the exponents and identify the TVSO value corresponding to the minimum of the curve (TVSOmin).

Figure 16:
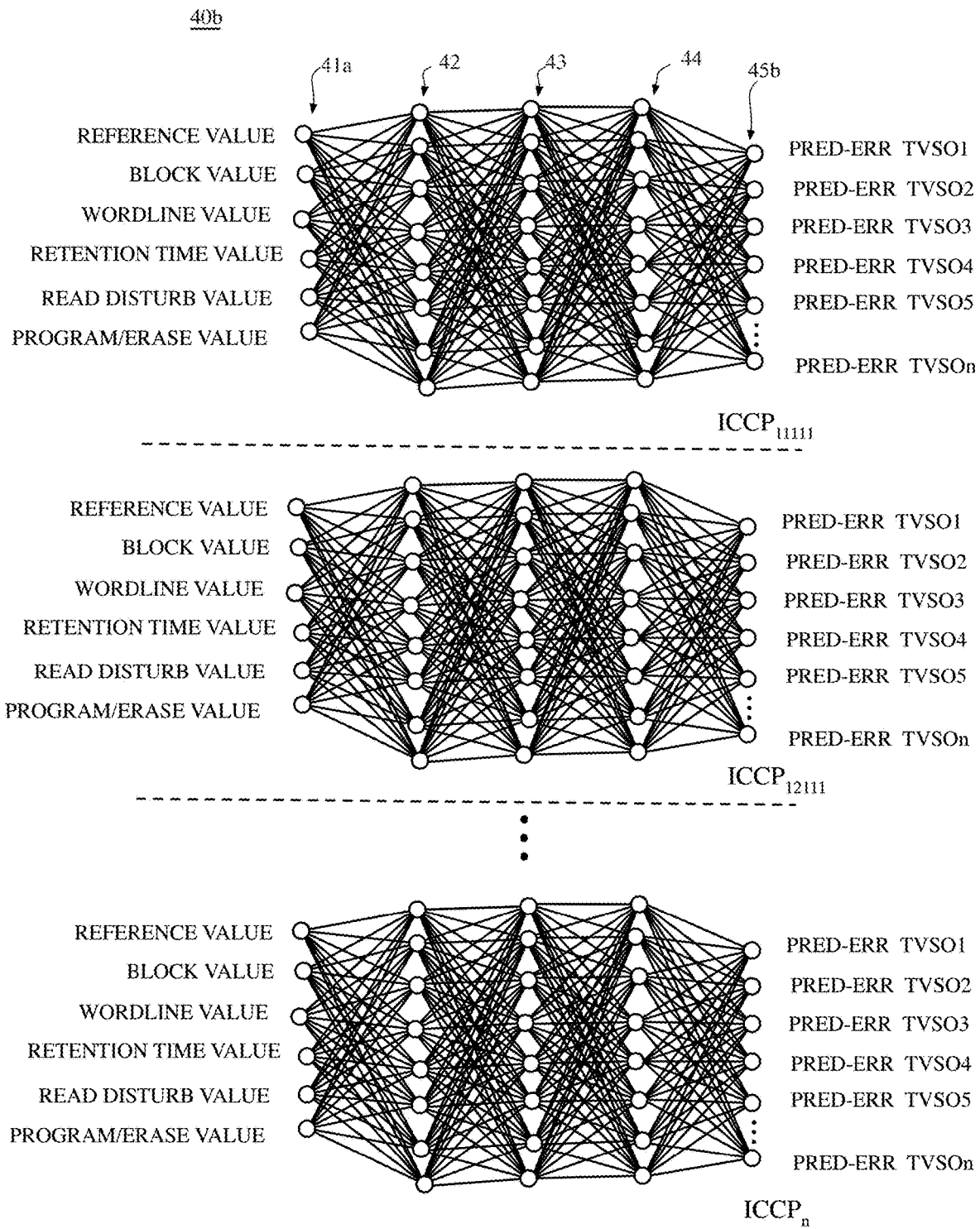

In the example shown in FIG. 16, output neurons 45b generate values that indicate the number of errors at locations corresponding to TVSO values. In this example, output neurons 45b include an output neuron generating an output for each TVSO value (for n TVSO values), such as, for example an output neuron that predicts the error when a first TVSO value is used (PRED-ERR TVSO1), an output neuron that predicts the error when a second TVSO value is used (PRED-ERR TVSO2), an output neuron that predicts the error when a third TVSO value is used (PRED-ERR TVSO3), an output neuron that predicts the error when a fourth TVSO value is used (PRED-ERR TVSO4), an output neuron that predicts the error when a fifth TVSO value is used (PRED-ERR TVSO5) and so on, to an output neuron that predicts the error when an $n^{th}$ TVSO value is used (PRED-ERR TVSOn). In one specific example, TVSO values from −32, . . . 0, . . . +32 are used and PRED-ERR TVSO1 is the predicted error when a TVSO of −32 is used, PRED-ERR TVSO2 is the predicted error when a TVSO of −31 is used, PRED-ERR TVSO3 is the predicted error when a TVSO of −30 is used, PRED-ERR TVSO4 is the predicted error when a TVSO of −29 is used, PRED-ERR TVSO5 is the predicted error when a TVSO of −28 is used, and PRED-ERR TVSOn is the predicted error when a TVSO of +32 is used.

When the output is values that indicate the magnitude of the number of errors at locations corresponding to TVSO values as is shown in FIG. 16, in step 209 minimum finder program 83 need only identify which output generates the lowest error to determine the TVSO value corresponding to the minimum value of the TVSE curve since it is known which TVSO value corresponds to each output neuron. However, when the output neurons generate output in the form of exponents, minimum finder program 83 includes an algorithm for identifying where the minimum value is (e.g., where on the x-axis) and that identifies the TVSO value that corresponds to the identified minimum point on the curve (e.g., the closest whole number TVSO value to the identified minimum point on the curve).

Figure 17:
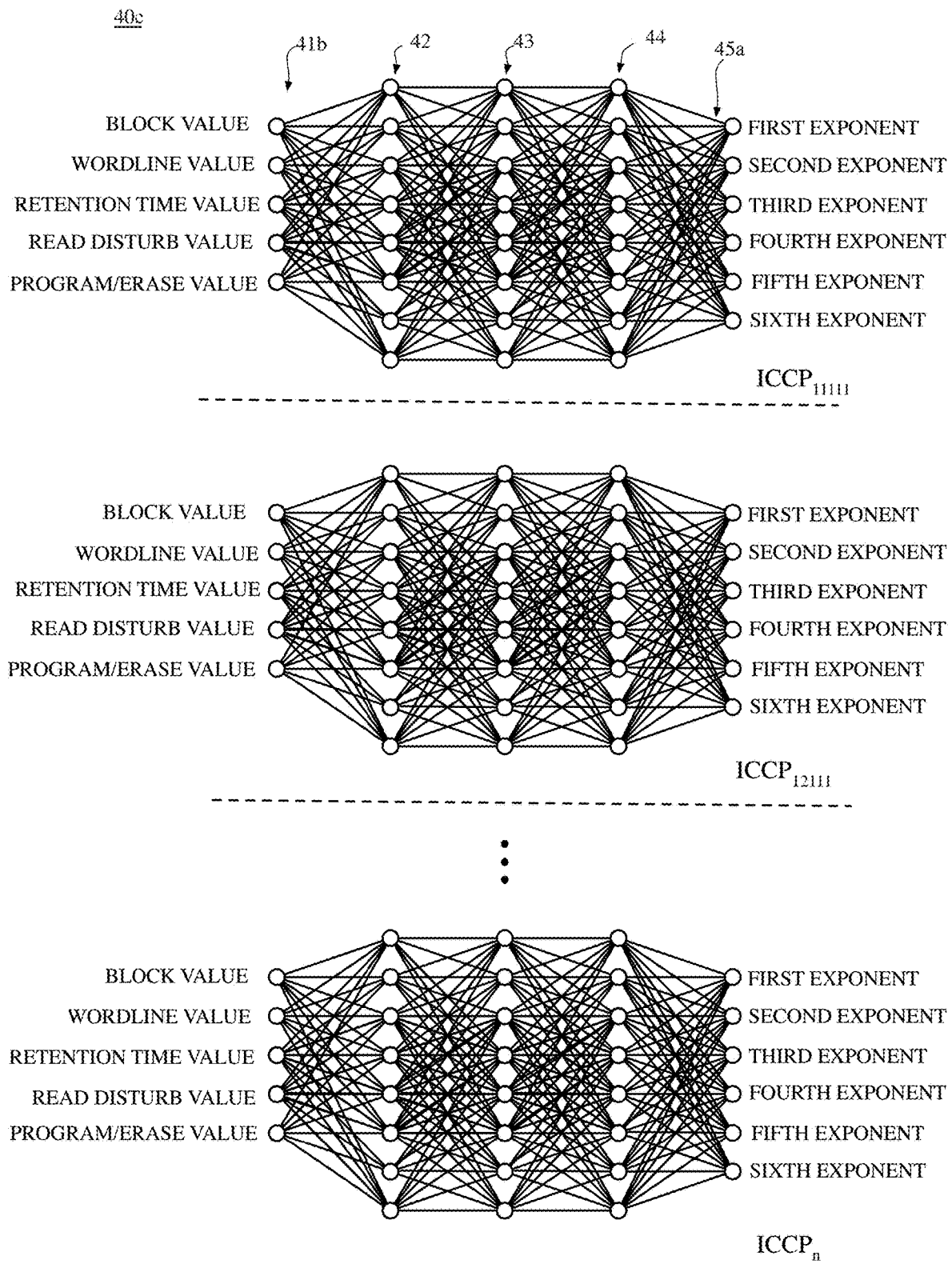
Figure 18:
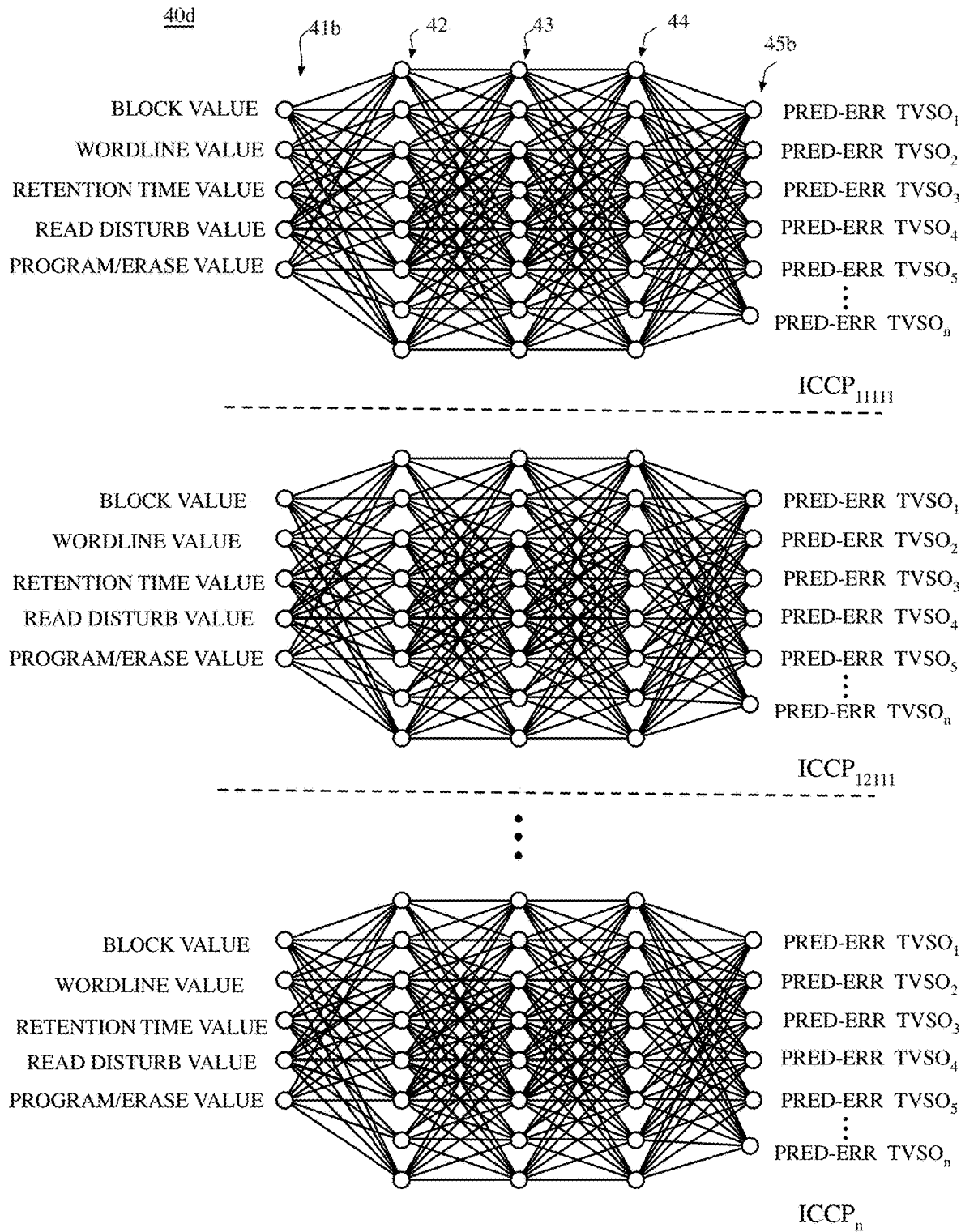

FIG. 17 shows an exemplary MCNNI-TVSO inference Model 40c that is the same as the MCNNI-TVSO inference model 40a shown in FIG. 15 except that each ICCP includes input neurons 41b having one less input neuron than does model 40a, and it does not include a reference value as an input. FIG. 18 shows an exemplary MCNNI-TVSO inference model 40d that is the same as the MCNNI-TVSO inference Model 40b shown in FIG. 16 except that each ICCP includes input neurons 41b having one less input neuron than does model 40a, and it does not include a reference value as an input.

Figure 19:
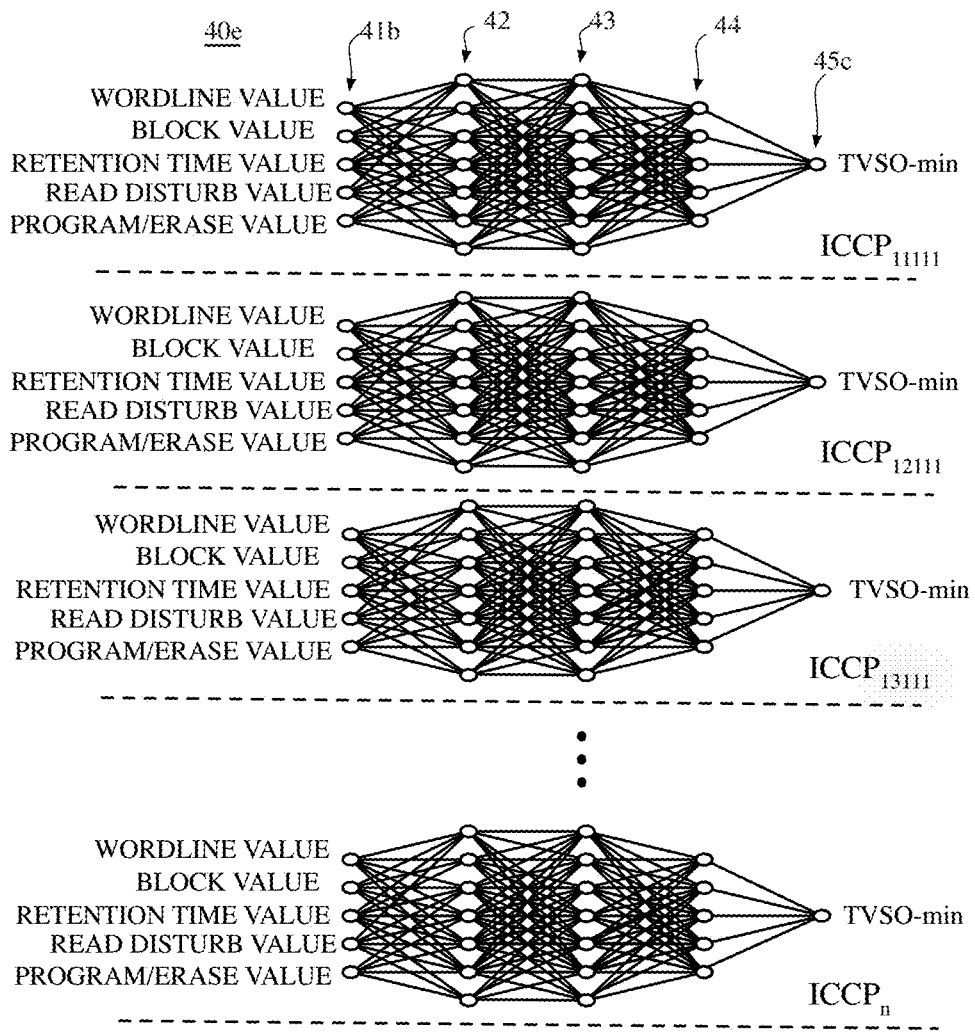

FIG. 19 illustrates a MCNNI-TVSO model that generates output at an output neuron 45c that indicates a Threshold Voltage Shift Offset (TVSO) value corresponding to a minimum number of errors for a Threshold-Voltage-Shift Read-Error (TVS-RE) curve (TVSO-min). Since this embodiment indicates the TVSO-min, step 209 need not be performed and minimum finder 17 is not required. Instead, the TVSO-min corresponding to the TVSO-min that corresponds to the input usage values identified in step 207 is output in step 208 to the read circuit 6 or stored in data storage 4 (e.g., in table 15a).

The method and apparatus of the present invention models multiple factors that affect UBER and generates, on the flash controller, output identifying a TVSOmin of a TVS-RE curve that accurately reflects the physical characteristics of the location that is to be read, both the structural characteristics of the location that is to be read (e.g., the wordline and the block that is to be read), the current age/physical degradation of the location that is to be read (e.g., the number of P/E cycles) and the current transitory characteristics of the location that is to be read (e.g., closed-block read disturb and closed-block retention time). Because the generated TVS-RE curve accurately represents the factors that affect UBER, the TVSOmin will be the appropriate TVSO value for performing the read (corresponding to the TVSO value that provides a minimum number of errors during device characterization). Using the appropriate TVSO value for performing the read results in a reduced number of read errors at the flash controller. The reduced number of read errors of the method and apparatus of the present invention effectively maintains UBER within acceptable levels during the lifetime of the SSD.

Further, for purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

What is claimed is:

1. A method for performing an inference operation at a flash controller integrated circuit comprising:

storing configuration files of a neural network inference model on the flash controller integrated circuit, the neural network inference model including a plurality of Independent Categorized-Core-Portions (ICCPs), respective ICCPs corresponding to one of a plurality of categories for respective parameters of the neural network inference model and including input neurons, output neurons and hidden neurons coupled to the input neurons and the output neurons, the neural network inference model having a weighting matrix comprising rows and columns of weighting values, a first plurality of weighting values on respective rows having a non-zero value and a second plurality of weighting values on respective rows having a value of zero, respective ICCPs having the same number of input neurons, the same number of hidden neurons, the same number of output neurons, and the same connections between input neurons, hidden neurons and output neurons as the other ICCPs, and none of the input neurons, output neurons or hidden neurons of a particular ICCP effectively coupled to any of the input neurons, output neurons or hidden neurons of any of the other ICCPs responsive to zero values of the weighting matrix, wherein respective ICCPs correspond to a single category of wordline values, a single category of block values, a single category of retention time values, a single category of read-disturb values and a single category of program/erase values;

loading the configuration files of the neural network inference model into a neural network engine of the flash controller integrated circuit to form a neural network inference core;

monitoring the operation of the flash controller integrated circuit to identify a usage values of a flash memory device, the identified usage values including a wordline value, a block value, a read disturb value, a retention time value and a program/erase value, wherein a status circuit is to count the number of reads of a closed block of the flash memory device to identify the read disturb value, to start a timer when a respective block of the flash memory device is closed to determine retention time value and to count the number of program and erase cycles of a respective block of the flash memory device to identify the program/erase value;

performing, by the neural network engine, a single neural network operation on the neural network inference core using the identified usage values as input to respective ICCPs to generate output values at the output neurons of respective ICCPs;

identifying, at the flash controller integrated circuit, the output values of the respective ICCP that corresponds to the input usage values by identifying an index value corresponds to the input usage values and identifying the respective ICCP that corresponds to the index value, the identified output values indicating an estimation of coefficients of a Threshold-Voltage-Shift Read-Error (TVS-RE) curve or a number of errors of the TVS-RE curve;

identifying, by circuitry of the flash controller integrated circuit, a threshold voltage shift offset (TVSO) value that corresponds to a minimum point of the TVS-RE curve; and performing a read of the flash memory device using the identified TVSO value.

2. The method of claim 1, comprising generating the neural network inference model by:

receiving, at a computer, input indicating architecture of a neural network inference model, the architecture including a plurality of parameters;

receiving, at the computer, input indicating a plurality of different categories for respective parameters;

generating, by the computer, an initial neural network inference model having the plurality of ICCPs;

receiving, at the computer, a data set containing data records, respective data records including one or more parameter value;

creating, by the computer, a training data set, a validation data set and a test data set by dividing the received data records;

training the initial neural network inference model at t computer by:

selecting a category;

selecting a data record from the training data set having a parameter value corresponding to the selected category;

performing a backpropagation algorithm on neurons corresponding to the selected category using the selected training data record;

repeating the selecting a data record and the performing a backpropagation algorithm until all data records in the training data set corresponding to the selected category have been processed; and continuing, at the computer, the selecting a category, selecting a data record, performing a backpropagation algorithm and the repeating until all categories have been processed.

3. The method of claim 1,
wherein a first input neuron of respective ICCPs is to receive the wordline value, a second input neuron of respective ICCPs is to receive the block value, a third input neuron of respective ICCPs is to receive the retention time value, a fourth input neuron of respective ICCPs is to receive the read-disturb value and a fifth input neuron of respective ICCPs is to receive the program/erase value.

4. A flash controller integrated circuit comprising:
a data storage to store a Multi-Core Neural Network Inference (MCNNI) model, the MCNNI model including a plurality of Independent Categorized-Core-Portions (ICCPs), respective ICCPs corresponding to one of a plurality of categories for respective parameters in the MCNNI model and including input neurons, output neurons and hidden neurons coupled to the input neurons and the output neurons, respective ICCPs having the same number of input neurons, the same number of hidden neurons, the same number of output neurons, and the same connections between input neurons, hidden neurons and output neurons as the other ICCPs, the MCNNI model having a weighting matrix comprising rows and columns of weighting values, a first plurality of weighting values on respective rows having a non-zero value and a second plurality of weighting values on respective rows having a value of zero, none of the input neurons, output neurons or hidden neurons of a particular ICCP effectively coupled to any of the input neurons, output neurons or hidden neurons of any of the other ICCPs responsive to the zero values of the weighting matrix;
a write circuit to encode received data into a codeword and to send the codeword, along with a corresponding program instruction, to a flash memory device that is separate from the flash controller integrated circuit for storing codeword in the flash memory device;
a status circuit to monitor the operation of the flash controller integrated circuit to identify usage values of the flash memory device, the identified usage values including a wordline value, a block value, a read disturb value, a retention time value and a program/erase value, wherein the status circuit is to count the number of reads of a closed block the flash memory device to identify the read disturb value, to start a timer when a respect block of the flash memory device is closed to determine the retention time value and to count the number of program and erase cycles of a respective block of the flash memory device to identify the program/erase value;
a neural network engine coupled to the data storage, the flash controller integrated circuit to load the MCNNI model into the neural network engine to form a MCNNI core and the neural network engine to perform a single neural network operation of the MCNNI core using the usage values as input to the single neural network operation to generate output values for respective ICCPs;
a selection circuit to identify the output values of the respective ICCP that corresponds to the input usage values by identifying an index value that corresponds to the input usage values and identifying the respective ICCP that coresponds to the index value, the identified output values indicating an estimation of coeffiecients of a Threshold-Voltage-Shift Read-Error (TVS-RE) curve or a number of errors of the TVS-RE curve;
a minimum finder circuit to identify a threshold voltage shift offset (TVSO) value corresponding to a minimum point of the TVS-RE curve; and
a read circuit to send a threshold-voltage-shift read instruction to the flash memory device that includes the identified TVSO value, the flash memory device to respond by performing a read of the flash memory device to obtain read results; and
a decoder coupled to the read circuit for decoding the read results to obtain the stored codeword.

5. The flash controller integrated circuit of claim 4,
wherein respective ICCPs correspond to a single category of wordline values, a single category of block values, a single category of retention time values, a single category of read-disturb values and a single category of program/erase values, and
wherein a first input neuron of respective ICCPs is to receive the wordline value, a second input neuron of respective ICCPs is to receive the block value, a third input neuron of respective ICCPs is to receive the retention time value, a fourth input neuron of respective ICCPs is to receive the read-disturb value and a fifth input neuron of respective ICCPs is to receive the program/erase value.

* * * * *

UNITED STATES PATENT AND TRADEMARK OFFICE
CERTIFICATE OF CORRECTION

| | | |
|---|---|---|
| PATENT NO. | : 12,393,846 B2 | Page 1 of 1 |
| APPLICATION NO. | : 17/148200 | |
| DATED | : August 19, 2025 | |
| INVENTOR(S) | : Lorenzo Zuolo and Rino Micheloni | |

It is certified that error appears in the above-identified patent and that said Letters Patent is hereby corrected as shown below:

In the Specification

Column 6, Line 50 replace "values $x_{16}$" with --values $x_{15}$--.
Column 6, Line 52 replace "ICCP," with --ICCP$_{32}$--.
Column 7, Line 50 replace "has have" with --has--.
Column 7, Line 56 replace "as have" with --has--.
Column 9, Line 66 replace "curve is identified" with --curve--.
Column 10, Line 11 replace "de e-devices" with --devices--.
Column 10, Line 26 replace "e-devices" with --devices--.
Column 16, Line 65 replace "distribution" with --distribution.--.
Column 17, Line 66 replace "is are" with --are--.
Column 20, Line 8 replace "example" with --example,--.

In the Claims

Claim 1, Column 22, Line 6 replace "identify a" with --identify--.
Claim 4, Column 23, Line 48 replace "block" with --block of--.
Claim 4, Column 24, Line 2 replace "respect" with --respective--.
Claim 4, Column 24, Line 19 replace "coresponds" with --corresponds--.
Claim 4, Column 24, Line 20 replace "coeffiecients" with --coefficients--.
Claim 4, Column 24, Line 25 delete the word "and".

Signed and Sealed this
Second Day of December, 2025

John A. Squires
*Director of the United States Patent and Trademark Office*